(12) United States Patent
Minemoto et al.

(10) Patent No.: US 7,754,012 B2
(45) Date of Patent: Jul. 13, 2010

(54) APPARATUS FOR PRODUCTION OF CRYSTAL OF GROUP III ELEMENT NITRIDE AND PROCESS FOR PRODUCING CRYSTAL OF GROUP III ELEMENT NITRIDE

(75) Inventors: Hisashi Minemoto, Osaka (JP); Yasuo Kitaoka, Osaka (JP); Isao Kidoguchi, Hyogo (JP); Yusuke Mori, c/o Graduate School of Engineering, Osaka, Suita-shi, Osaka (JP) 565-0871; Fumio Kawamura, Osaka (JP); Takatomo Sasaki, Osaka (JP); Hidekazu Umeda, Osaka (JP); Yasuhito Takahashi, Osaka (JP)

(73) Assignees: Panasonic Corporation, Osaka (JP); Yusuke Mori, Osaka (JP)

( * ) Notice: Subject to any disclaimer, the term of this patent is extended or adjusted under 35 U.S.C. 154(b) by 0 days.

(21) Appl. No.: 12/082,745

(22) Filed: Apr. 14, 2008

(65) Prior Publication Data

US 2008/0213158 A1 Sep. 4, 2008

Related U.S. Application Data

(62) Division of application No. 10/587,223, filed as application No. PCT/JP2005/008072 on Apr. 27, 2005, now Pat. No. 7,381,268.

(30) Foreign Application Priority Data

Apr. 27, 2004 (JP) .............................. 2004-130620

(51) Int. Cl.
C30B 25/00 (2006.01)
C30B 23/00 (2006.01)
C30B 28/12 (2006.01)
C01B 21/06 (2006.01)

(52) U.S. Cl. ................. 117/89; 117/2; 117/3; 423/406; 423/409

(58) Field of Classification Search ................. 423/406, 423/409
See application file for complete search history.

(56) References Cited

U.S. PATENT DOCUMENTS 3,833,342 A 9/1974 Holliday et al.

(Continued)

FOREIGN PATENT DOCUMENTS

EP 0 811 708 12/1997

(Continued)

*Primary Examiner*—Jerry Lorengo
*Assistant Examiner*—Joseph V Micali
(74) *Attorney, Agent, or Firm*—Hamre, Schumann, Mueller & Larson, P.C.

(57) ABSTRACT

A method for manufacturing Group III nitride crystals with high quality is provided. By the method, a crystal raw material solution and gas containing nitrogen are introduced into a reactor vessel, which is heated, and crystals are grown in an atmosphere of pressure applied thereto. The gas is introduced from a gas supplying device to the reactor vessel through a gas inlet of the reactor vessel, and then is exhausted to the inside of a pressure-resistant vessel through a gas outlet of the reactor vessel. Since the gas is introduced directly to the reactor vessel, impurities attached to the pressure-resistant vessel and the like into the crystal growing site can be prevented. Further, the gas flows through the reactor vessel, to suppress aggregation of an evaporating alkali metal, etc., at the gas inlet and reduce flow of the metal vapor into the gas supplying device.

27 Claims, 12 Drawing Sheets

U.S. PATENT DOCUMENTS

| | | | |
|---|---|---|---|
| 4,620,897 A * | 11/1986 | Nakajima | 117/18 |
| 5,433,169 A * | 7/1995 | Nakamura | 117/102 |
| 5,637,531 A | 6/1997 | Porowski et al. | |
| 5,656,077 A * | 8/1997 | Kawase | 117/200 |
| 6,592,663 B1 | 7/2003 | Sarayama et al. | |
| 6,676,752 B1 | 1/2004 | Suscavage et al. | |
| 6,770,135 B2 | 8/2004 | Schowalter et al. | |
| 6,887,736 B2 * | 5/2005 | Nause et al. | 438/104 |
| 7,022,378 B2 | 4/2006 | Das et al. | |
| 7,052,546 B1 | 5/2006 | Motakef et al. | |
| 7,221,037 B2 | 5/2007 | Kitaoka et al. | |
| 2002/0175338 A1 | 11/2002 | Sarayama et al. | |
| 2004/0144300 A1 * | 7/2004 | Kitaoka et al. | 117/2 |
| 2004/0226503 A1 * | 11/2004 | Iwata et al. | 117/2 |
| 2005/0011436 A1 | 1/2005 | Liu | |
| 2007/0138499 A1 * | 6/2007 | Sakurai | 257/103 |

FOREIGN PATENT DOCUMENTS

| | | |
|---|---|---|
| JP | 2001-58900 | 3/2001 |
| JP | 2001-102316 | 4/2001 |
| JP | 2002-68897 | 3/2002 |
| JP | 2002-241112 | 8/2002 |
| JP | 2002-293696 | 10/2002 |

* cited by examiner

APPARATUS FOR PRODUCTION OF CRYSTAL OF GROUP III ELEMENT NITRIDE AND PROCESS FOR PRODUCING CRYSTAL OF GROUP III ELEMENT NITRIDE

CROSS-REFERENCE TO RELATED APPLICATIONS

This application is a Division of application Ser. No. 10/587,223, filed Jul. 24, 2006, which is a U.S. National Stage of PCT/JP2005/008072, filed Apr. 27, 2005, which applications are incorporated herein by reference.

TECHNICAL FIELD

The present invention relates to a manufacturing apparatus of Group III nitride crystals and a method for manufacturing Group III nitride crystals.

BACKGROUND ART

Group III nitride compound semiconductor such as gallium nitride (GaN) (hereinafter also referred to as a "Group III nitride semiconductor" or a "GaN-based semiconductor") has been gaining attention as a material for semiconductor elements that emit blue or ultraviolet light. A blue laser diode (LD) is used for high-density optical disk devices or displays while a blue light emitting diode (LED) is used for displays, lighting, etc. It is expected to use an ultraviolet LD in the field of biotechnology or the like and an ultraviolet LED as an ultraviolet source for a fluorescent lamp.

Generally, Group III nitride semiconductor substrates (for example, GaN substrate) that are used for LDs or LEDs are formed by vapor phase epitaxy. For instance, Group III nitride crystals are grown heteroepitaxially on a sapphire substrate. However, the quality of crystals obtained through vapor phase epitaxy has a problem. More specifically, crystals obtained by this method generally have a dislocation density of $10^8$ cm$^{-2}$ to $10^9$ cm$^{-2}$ and thus reducing dislocation density has been an important issue. In order to deal with this issue, efforts have been made to reduce the dislocation density and thereby, for example, an epitaxial lateral overgrowth (ELOG) method has been developed. With this method, the dislocation density can be reduced, but the implementation thereof is complicated, which poses a problem in practical utilization.

On the other hand, besides the vapor phase epitaxy, a method of carrying out crystal growth from the liquid phase also has been studied. At the beginning, the liquid phase growth method required super high pressures and super high temperatures. In this connection, a method has been developed in which crystals are grown in Na flux, thus enabling the alleviation of the pressure and temperature conditions up to about 50 atm (50×1.01325×10$^5$ Pa) at about 700° C. Recently, single crystals whose maximum crystal size is about 1.2 mm can be obtained by a method in which a mixture of Ga and Na is melted in a nitrogen gas atmosphere containing ammonia at 800° C. and 50 atm (50×1.01325×10$^5$ Pa), and then crystals are grown for 96 hours using the melt (see, for instance, Patent document 1). Further, a crystal growth apparatus and a growth method have been proposed in which pressure is applied to and heat is applied externally to a reactor vessel (for example, see Patent document 2).

FIG. 17 shows one example of the manufacturing apparatus used for a liquid phase growth method (see Patent document 3). As shown in this drawing, in this apparatus, a reactor vessel 720 is stored in a pressure-resistant vessel 702. Inside the pressure-resistant vessel 702, there is a space surrounded by a heat insulator 711, on an inner wall of which a heater 710 is placed. The reactor vessel 720 is placed in such a space. A pressure regulator 770 is placed at the top of the pressure-resistant vessel 702. A lid 721 is attached to the reactor vessel 720, and a through hole 724 is formed in this lid 721.

GaN crystals are manufactured using this apparatus, for example, as follows. First, Ga and N are put in the reactor vessel 720, and this reactor vessel 720 is stored in the pressure-resistant vessel 702. Then, pressure is applied to the pressure-resistant vessel 702 in a gas atmosphere containing nitrogen while applying heat thereto by the heater 710, so that Ga and Na are melted in the reactor vessel 720. In this drawing, numeral 731 denotes the thus melted Ga and Na. Nitrogen is dissolved in the melted Ga and Na, thus leading to the generation of GaN and the growth of crystals.

Another manufacturing apparatus also has been proposed, including two pressure regulators, one of which supplies gas to a reactor vessel and the other supplies gas to a pressure-resistant vessel, thus allowing gas system is to be controlled independently between in the reactor vessel and in the pressure-resistant vessel provided outside of the reactor vessel (for example, see Patent document 4).

Patent document 1: JP 2002-293696 A
Patent document 2: JP 2001-102316 A
Patent document 3: JP 2002-68897 A
Patent document 4: JP 2001-58900 A

DISCLOSURE OF INVENTION

Problem to be Solved by the Invention

The liquid phase growth method has the advantages of simple manufacturing process and the capability of increasing crystals obtained in size. However, the quality of the crystals obtained is still insufficient, and especially in the field of Group III nitrides such as GaN, the improvement of the quality of crystals obtained has been demanded. Therefore, it is an object of the present invention to provide a manufacturing apparatus for Group III nitride crystals and a method for manufacturing Group III nitride crystals, by which high quality crystals can be manufactured.

Means for Solving Problem

In order to achieve the above-stated object, a crystal manufacturing apparatus of the present invention is for enabling growth of Group III nitride crystals using a crystal raw material solution containing Group III elements, nitrogen and at least one of an alkali metal and an alkaline-earth metal. The Group III nitride crystals are grown in an atmosphere of gas containing nitrogen by applying heat and pressure thereto so as to allow the nitrogen and the Group III elements in the crystal raw material solution to react with each other. The apparatus includes: a reactor vessel in which the crystal raw material solution can be placed; and a gas supplying device for introducing the gas containing nitrogen into the reactor vessel. The reactor vessel and the gas supplying device are coupled. The reactor vessel has a gas inlet and a gas outlet. Gas containing nitrogen out of the gas containing nitrogen introduced through the gas inlet that is not used for the reaction is exhausted through the gas outlet.

A crystal manufacturing method of the present invention includes the steps of preparing a crystal raw material solution containing Group III elements, nitrogen and at least one of an alkali metal and an alkaline-earth metal in a reactor vessel, applying heat and pressure thereto in an atmosphere of gas containing nitrogen so as to allow the nitrogen and the Group III elements in the crystal raw material solution to react with each other, whereby Group III nitride crystals are grown. The reactor vessel has a gas inlet and a gas outlet, the reactor vessel and a gas supplying device are coupled, and in the reactor vessel, gas containing nitrogen out of gas containing nitrogen introduced through the gas inlet that is not used for the reaction is exhausted through the gas outlet.

EFFECTS OF THE INVENTION

In order to achieve the above-stated object, the inventors of the present invention have conducted a series of investigations. During the course of the research, the inventors found that impurities mixed into gas that is to be introduced into a reactor vessel adversely affect the quality of obtained crystals. As a result of additional research, it further was found that the mixing of impurities into the gas to be introduced into the reactor vessel is caused by a pressure-resistant vessel. That is, a conventional apparatus is configured so that gas is introduced into a pressure-resistant vessel, and such gas is then introduced into a reactor vessel. With this configuration, impurities such as water and oxygen, which are attached to a heater, a heat insulator, an inner wall of the pressure-resistant vessel and the like, are mixed into the site of the crystal growth, which adversely affects the quality of crystals obtained. On the other hand, according to the apparatus and the manufacturing method of the present invention, the gas containing nitrogen is introduced directly to the reactor vessel without passing through the pressure-resistant vessel, thus preventing impurities attached to the heater, the heat insulator, the pressure-resistant vessel, etc., from mixing into the site of the crystal growth. As a result, it is possible to improve the quality of the crystals obtained. Further, by controlling impurities, gas with reduced impurities can be supplied always from the gas supplying device, and therefore the density of dopants in crystals can be controlled easily, resulting in improved controllability of the carrier density.

Further, in a conventional apparatus, the following problem occurs frequently: when crystals are grown using alkali metal, the evaporating alkali metal aggregates at a gas inlet and a pipe connected to the gas inlet, with which the gas inlet and the pipe are clogged, causing a failure in the supply of gas containing nitrogen to a reactor vessel. In order to cope with such a problem, the inventors of the present invention further conducted investigation. As a result, it was found that this was caused by the fact that gas hardly flows in a reactor vessel. That is, in a conventional apparatus, a nitrogen component only is supplied through a gas inlet into a reactor vessel that is subjected to reaction, and gas hardly flows, thus causing aggregation of alkali metal or the like at the gas inlet and a pipe connected to the gas inlet due to diffusion. Additionally, in some cases, an alkali metal and an alkaline-earth metal flow into a pipe connected to a gas inlet and a gas supplying device and chemically attack them, and a dissolved substance generated by the chemical-attacking is mixed into the site of the crystal growth, which adversely affects the quality of crystals obtained. On the other hand, according to the apparatus and the manufacturing method of the present invention, a reactor vessel used includes a gas outlet in addition to a gas inlet, and gas containing nitrogen, introduced through the gas inlet, that is not subjected to reaction in the reactor vessel can be exhausted through the gas outlet, and therefore gas can flow continuously in a fixed direction in the reactor vessel. Thus, the aggregation of an alkali metal, an alkaline-earth metal, etc, at the gas inlet, the gas outlet and the pipes connected therewith and the inflow of an alkali metal, an alkaline-earth metal, etc, into a gas supplying device through the gas inlet can be prevented. As a result, the quality of crystals obtained further can be improved.

Figure 1:
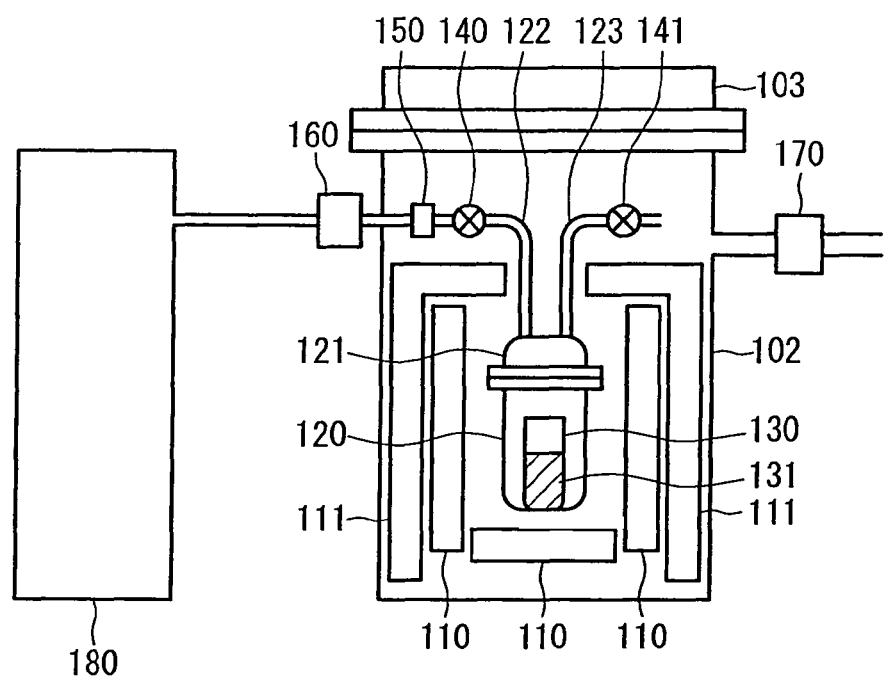
FIG. 1 is a schematic diagram showing the configuration of one example of a crystal manufacturing apparatus of the present invention.

DESCRIPTION OF NUMERALS 102, 202, 302, 402, 702 pressure-resistant vessel
103, 203, 303, 403 lid of a pressure-resistant vessel
110, 310, 710, 410 heater
111, 211, 311, 411, 711 heat insulator
120, 220, 320, 420, 520, 720 reactor vessel
121, 221, 321, 42.1, 521, 721 lid of a reactor vessel
122, 123, 222, 223, 322, 323, 422, 423, 522, 523 pipe
130, 230, 330, 430, 530 crucible
131, 231, 331, 431, 531, 731 crystal raw material 140, 141, 240, 241, 340, 341, 440, 441 gas open/close mechanism (valve)
150, 250, 350, 351, 450 junction
160, 260, 360, 361, 460 gas flow rate regulator
170, 270, 370, 371, 470 pressure regulator
180, 280, 380, 381, 480 gas supplying device
212 high-frequency heater
381 second gas supplying device
524 gas inlet
525 gas outlet
526 gas exhaustion tube
532 droplets
590 baffle plate
591 cooling tube
592 drops guide
593, 724 through hole
90 semiconductor element
91 substrate
92, 98 contact layer
93, 97 cladding layer
94, 96 light-guiding layer
95 multiple quantum well layer
99 insulation film
100 p-side electrode
101 n-side electrode

DESCRIPTION OF THE INVENTION

Preferably, the apparatus of the present invention further includes: a pressure-resistant vessel; and a heater that applies heat to the reactor vessel. The reactor vessel is stored in the pressure-resistant vessel, and the reactor vessel and the gas supplying device are coupled via the gas inlet. Further, in the apparatus of the present invention, preferably, the gas containing nitrogen supplied from the gas supplying device firstly passes through the gas inlet and is introduced into the reactor vessel, and gas containing nitrogen out of the gas containing nitrogen introduced that is not used for the reaction then can be exhausted through the gas outlet to at least one of an inside of the pressure-resistant vessel and an outside of the pressure-resistant vessel. The number of the gas inlet and the gas outlet is not limited especially, and they may be one or plural. Herein, in the apparatus and the manufacturing method of the present invention, the reactor vessel is not limited especially, as long as it includes holes capable of letting gas containing nitrogen in and out of the reactor vessel as the gas inlet and the gas outlet. For instance, pipes or the like may be connected to the gas inlet and the gas outlet. As specific examples of the gas inlet, the configuration with a hole formed in a reactor vessel as a gas inlet and the configuration with a pipe or the like connected to the hole are included, for example. As specific examples of the gas outlet, the configuration with a hole formed in a reactor vessel as a gas outlet, the configuration with a pipe or the like connected to the hole and the configuration with a gas exhaustion tube, described later, connected to the hole are included.

In the apparatus of the present invention, the gas inlet and the gas outlet preferably have inner diameters of 10 mm or less, more preferably 5 mm or less and still more preferably 0.5 mm to 2 mm. With the above-stated range, the diffusion of the evaporating alkali metal, alkaline-earth metal, etc, to the gas inlet, the aggregation at the gas inlet, the gas outlet and the pipes connected thereto, and the inflow of impurity gas (e.g., water and oxygen) from the heater or the like in the pressure-resistant vessel to the reactor vessel through the gas outlet further can be suppressed. The ratio between the inner diameter (A) of the gas inlet and the inner diameter (B) of the gas outlet (A:B) preferably is 1:2 to 2:1, for example. For instance, in the case where the inner diameter of the gas outlet is made smaller with respect to the inner diameter of the gas inlet, the inflow of impurity gas from the outside of the reactor vessel through the gas inlet further can be reduced. On the other hand, in the case where the inner diameter of the gas outlet is made larger with respect to the inner diameter of the gas inlet, the back-flow of the alkali metal, the alkaline-earth metal, etc., to the gas supplying device through the gas inlet further can be prevented.

In the apparatus of the present invention, a flow velocity of the gas containing nitrogen at at least one of the gas inlet and the gas outlet of the reactor vessel preferably is 1 cm/sec to 500 cm/sec, more preferably 1 cm/sec to 50 cm/sec and still more preferably 2 cm/sec to 10 cm/sec. More preferably, the flow velocity at both of the gas inlet and the gas outlet of the reactor vessel is within the above-stated range. With the above-stated range, the diffusion of the evaporating alkali metal, alkaline-earth metal, etc, to the gas inlet, the aggregation at the gas inlet, the gas outlet and the pipes connected thereto, and the inflow of impurity gas (e.g., water and oxygen) from the heater or the like in the pressure-resistant vessel to the reactor vessel through the gas outlet further can be suppressed. In addition, an increase in evaporation of the alkali metal, the alkaline-earth metal, etc., from the crystal raw material solution due to the gas flow can be suppressed. Thus, excellent quality crystals can be obtained with a better reproducibility. Herein, the above-stated flow velocity is a value at an ambient pressure and an ambient temperature in the reactor vessel.

Preferably, the apparatus of the present invention further includes a cooling tube and a gas exhaustion tube. The gas exhaustion tube is placed at the gas outlet, and the cooling tube is placed closer to or in contact with the perimeter of the gas exhaustion tube. In this way, by placing the cooling tube for the gas exhaustion tube and cooling the gas exhausting tube, the vapor such as the alkali metal, the alkaline-earth metal, etc, can be cooled in the vicinity of the gas outlet to be liquefied (to be droplets), which can be reused as a crystal raw material solution. The gas exhaustion tube may penetrate through the gas outlet so that one end of the gas exhaustion tube is placed in the reactor vessel, or may be placed outside the reactor vessel via the gas outlet. The shape of the gas exhaustion tube is not limited especially, and for example, a cylindrical shape, a funnel shape or the like is possible. For instance, the funnel shape can prevent the clogging of the liquefied alkali metal, the alkaline-earth metals, etc., in the gas exhaustion tube and further can reduce the evaporation of the alkali metal, the alkaline-earth metal, etc. In this case, the inner diameter of the gas outlet is 3 mm to 50 mm, for example, and preferably 5 mm to 20 mm. The internal structure of the gas exhaustion tube, which is not a limiting example, preferably includes funnel structures stacked as a multistage in which adjacent funnel structures have centers displaced from each other, so that gas can pass therethrough in a meandering manner. The above-stated cooling tube is not limited especially, and a cooling tube with an inner diameter of 1 mm to 5 mm, for example, is preferable because the inside of the reactor vessel can be cooled more locally. As a coolant flowing through the cooling tube, nitrogen gas and an inert gas (e.g., argon, helium) at a room temperature are available, for example, which are not limiting examples. In this way, by using gas as the coolant, even when the cooling tube is broken partially, the coolant will not react with the component of the crystal raw material solution rapidly.

Preferably, the apparatus of the present invention further includes a drops guide. One end of the drops guide is placed at the gas exhaustion tube, and the other end is placed in the crystal raw material solution or in the vicinity of a liquid surface of the crystal raw material solution. The materials of the gas exhaustion tube and the drops guide are not limited especially, and a material that is less reactive with Group III elements, alkali metals and alkaline-earth metals, such as alumina, single crystal sapphire, boron nitride (BN), tungsten, tantalum, $Y_2O_3$, CaO or MgO, can be used.

Preferably, the apparatus of the present invention further includes a recovery device instead of the gas exhaustion tube or in addition to the gas exhaustion tube. The recovery device is connected to the pressure regulator, and the recovery device allows the recovery of the alkali metal and the alkaline-earth metal evaporating from the crystal raw material solution. Further, the recovery device may allow the recovery of Group III element, etc., evaporating from the crystal raw material solution. This configuration can prevent the evaporating alkali metal, alkaline-earth metal, etc., from being emitted to the air outside the apparatus. The recovery method by the recovery device of an alkali metal and an alkaline-earth metal having a high vapor pressure mainly is not limited especially, and a method of absorbing them with a porous member such as porous ceramic and porous metal is available. Alternatively, in the recovery device, the vapor such as the alkali metal and the alkaline-earth metal may be allowed to react with oxygen and to be absorbed into water for recovery, followed by a neutralization process. In general, the contamination by even slight amount of alkali metals, alkaline-earth metals and the like is unfavorable for a semiconductor manufacturing process. The above-stated recovery device can prevent the contamination by the alkali metals or the alkaline-earth metals as main components of the evaporating substance, even when the present apparatus is installed closer to other semiconductor manufacturing apparatuses.

Preferably, in the apparatus of the present invention, an extra length portion is provided to at least one of the gas inlet and the gas outlet. The shape of the extra length portion is not limited especially, and the shape like a coil-form or a waveform is preferable. With this configuration, the alkali metal, the alkaline-earth metal, etc., evaporating from the crystal raw material solution collide with the tube wall of the extra length portion, thus making it difficult to diffuse to the outside and suppressing the emission to the outside of the reactor vessel. Thereby, the emission of the vapor such as the alkali metal, the alkaline-earth metal, etc., to the outside of the reactor vessel can be suppressed, thus preventing corrosion of the heater or the like. Further, the diffusion of the evaporating alkali metal, alkaline-earth metal, etc, to the gas inlet, the aggregation at the gas inlet, the gas outlet and the pipes connected thereto, and the inflow of impurity gas (e.g., water and oxygen) from the heater or the like in the pressure-resistant vessel to the reactor vessel through the gas outlet further can be suppressed. Since the extra length portion can prevent the coagulation of the crystal raw material inside the extra length portion, the extra portion preferably is formed close to the heater when the reactor vessel is placed in the pressure-resistant vessel. The length of the extra length portion is not limited especially, and 5 mm or more is preferable, 20 mm or more is more preferable and 100 mm or more is still more preferable. The range of 50 mm to 500 mm is particularly preferable. By increasing the length of the extra length portion, the diffusion of the alkali metal, the alkaline-earth metal, etc., to the outside of the reactor vessel can be minimized.

In the apparatus of the present invention, preferably, in the reactor vessel, concentration gradient can be formed for the alkali metal and the alkaline-earth metal evaporating from the crystal raw material solution. In this way, by using the reactor vessel in which concentration gradient can be formed for the alkali metal and the alkaline-earth metal evaporating from the crystal raw material solution, the evaporation of the alkali metal, the alkaline-earth metal, etc., from the crystal raw material solution can be suppressed, and the clogging at the gas outlet by the attachment of the evaporating alkali metal, the alkaline-earth metal, etc., thereto can be suppressed.

In the apparatus of the present invention, as the reactor vessel capable of forming the concentration gradient, a reactor vessel with a gas outlet formed close to a gas inlet and a reactor vessel having a baffle plate with a through hole formed therein are available, for example. In the case where the gas outlet is formed close to the gas inlet, since gas containing nitrogen is supplied always in the vicinity of the gas inlet, there is a tendency of decreasing the concentration of the alkali metal, the alkaline-metal, etc., there. As a result, the vicinity of the gas inlet has a low concentration of the alkali metal, the alkaline-earth metal, etc., inside the reactor vessel. For instance, in the case where the apparatus includes one gas inlet and a plurality of gas outlets, the gas outlets preferably are formed adjacent to the gas inlet so as to surround the gas inlet. Herein, even when the gas outlet is formed close to the gas inlet, since the gas containing nitrogen is supplied excessively relative to an amount required for the crystal growth, there is no problem occurring for the crystal growth. On the other hand, by providing a baffle plate, the concentration of the alkali metal, the alkaline-earth metal, etc., can be made lower at a portion around the gas outlet than at a portion close to a liquid surface of the crystal raw material solution. That is, by providing the baffle plate, the evaporation of the alkali metal, the alkaline-earth metal, etc., from the crystal raw material solution further can be suppressed, so that the emission of the vapor such as the alkali metal, the alkaline-earth metal, etc., to the outside of the reactor vessel can be reduced.

In the apparatus of the present invention, preferably, the baffle plate is placed in the reactor vessel closer to a liquid surface of the crystal raw material solution than the gas inlet and the gas outlet. The number of the baffle plate is not limited especially, and it may be one or plural. In the case where a crucible is placed in the reactor vessel, the baffle plate may be a lid of the crucible. The position of the through hole of the baffle plate is not limited especially, and preferably the through hole is formed so that the gas inlet and the through hole of the baffle plate are aligned. For instance, it is preferable that the inlet is formed at a top wall face portion of the reactor vessel and the through hole is formed directly below. More preferably, a pipe is connected to the gas inlet of the reactor vessel, and one end of the pipe is placed in the vicinity of the through hole. With this configuration, the evaporation of the alkali metal, the alkaline-earth metal, etc., from the crystal raw material solution further can be suppressed. The cross-sectional shape of the through hole of the baffle plate is not limited especially, and a taper shape that widens gradually toward a side of the gas inlet is available. This taper-shaped through hole allows the alkali metal and the alkaline-earth metal evaporating from the crystal raw material solution to be stored inside, so that the diffusion of the alkali metal and the alkaline-earth metal can be suppressed. The inner diameter of the through hole is 0.5 mm to 20 mm, for example, and preferably 1 mm to 5 mm. With such a range, while sufficient amount of nitrogen required for the crystal growth is supplied, and under the condition for further suppressing the evaporation of the alkali metal, the alkaline-earth metal, etc., from the crystal raw material, crystals can be grown. The number of the through hole is not limited especially, and it may one or plural, and for example, a plurality of through holes with a relatively small inner diameter of 0.5 mm to 3 mm, for example, may be formed.

In the apparatus of the present invention, preferably, a junction is placed at the gas inlet or at both of the gas inlet and the gas outlet, and the reactor vessel is detachable from the inside of the pressure-resistant vessel. Further, in the apparatus of the present invention, preferably, a gas open/close mechanism is placed at at least one of the gas inlet and the gas outlet. With this configuration, the contact of the crystal raw material or the like with the outside-air can be prevented, so that the quality of crystals obtained further can be improved. Such an apparatus can prevent the oxidation of the crystal raw material such as an easily oxidizable alkali metal, so that more excellent quality of crystals can be obtained. Herein, it is preferable that after putting the crystal raw material in the reactor vessel in an atmosphere of an inert gas outside of the pressure-resistant vessel, the reactor vessel is heated to form the crystal raw material solution. Thereby, at least one of the alkali metal and the alkaline-earth metal and the Group III elements can be made an alloy, and as compared with the case of melting these materials separately, the evaporation of high vapor pressure materials (e.g., the alkali metal and the alkaline-earth metal) can be suppressed. Note here that the inert gas refers to a rare gas such as helium gas or argon gas or nitrogen, which do not react with the crystal raw material at the respective process temperatures. Although nitrogen can be regarded as an inert gas at a low temperature, it does not behave as an inert gas at a crystal growth temperature but behaves as a reactive gas. It is preferable that the apparatus of the present invention further includes a means for performing agitation of the crystal raw material solution. The agitation means is not limited especially, and a propeller connected to a rotation motor is available, for example. The material of the propeller is not limited especially, and a material that is less reactive with Group III elements, alkali metals and alkaline-earth metals, such as alumina, single crystal sapphire, boron nitride (BN), tungsten, tantalum, $Y_2O_3$, CaO or MgO, can be used. By heating the crystal raw material and concurrently performing agitation, the crystal raw material solution can be made uniform speedily. The agitation by the propeller is not limited to during the crystal growth (at a high pressure), but this may be performed at a normal pressure as well (e.g., in a glove box), which is much easier than performing agitation at a high pressure.

In the apparatus of the present invention, the gas containing nitrogen supplied from the gas supplying device may control ambient pressures of both in the reactor vessel and in the pressure-resistant vessel. Preferably, the apparatus of the present invention-further includes a gas flow rate regulator; and a pressure regulator, The gas containing nitrogen is introduced from the gas supplying device to the reactor vessel via the gas flow rate regulator, the pressure-resistant vessel has a gas outlet, to which the pressure regulator is connected, and the gas flow rate regulator and the pressure regulator allow ambient pressures of both in the reactor vessel and in the pressure-resistant vessel to be controlled.

In the apparatus of the present invention, the gas supplying device may include a first gas supplying device and a second gas supplying device. The pressure-resistant vessel may have a gas inlet, the first gas supplying device may be connected to the gas inlet of the reactor vessel, the gas outlet of the reactor vessel directly may communicate with an outside of the pressure-resistant vessel, the second gas supplying device may be connected to the gas inlet of the pressure-resistant vessel, and the first gas supplying device and the second gas supplying device may allow ambient pressures in the reactor vessel and in the pressure-resistant vessel to be controlled independently. The pressure-resistant vessel further may have a gas outlet. Preferably, the apparatus of the present invention further includes: a first gas flow rate regulator; a second gas flow rate regulator; a first pressure regulator; and a second pressure regulator. Gas containing nitrogen is introduced from the first gas supplying device to the reactor vessel via the first gas flow rate regulator. The gas outlet of the reactor vessel is connected to the first pressure regulator. Gas is introduced from the second gas supplying device to the pressure-resistant vessel via the second gas flow rate regulator. The gas outlet of the pressure-resistant vessel is connected to the second pressure regulator. The first gas flow rate regulator and the first pressure regulator allow an ambient pressure in the reactor vessel to be controlled, and the second gas flow rate regulator and the second pressure regulator allow an ambient pressure in the pressure-resistant vessel to be controlled.

In the apparatus of the present invention, the gas introduced to the pressure-resistant vessel and the gas containing nitrogen introduced to the reactor vessel may be different or the same. In the case of being different, the gas may be different in type or the types may be the same but they are different in purity. For instance, the gas containing nitrogen introduced to the reactor vessel may be nitrogen, and the gas introduced to the pressure-resistant vessel may be a rare gas or air. Further, a purity of the gas containing nitrogen introduced to the reactor vessel may be 99.9% or more and a purity of the gas introduced to the pressure-resistant vessel may be 99% or less.

In the apparatus of the present invention, the supplying of the gas may be controlled by the combination of a pair of a gas flow rate regulator and a pressure regulator. When the temperature in the reactor vessel is increased from a room temperature to a crystal growth temperature (e.g., 800° C.), the temperature of the gases in the reactor vessel and in the pressure-resistant vessel is increased and the gases expand. Therefore, in the case of a gas flow rate regulator alone or a pressure regulator alone, it is difficult to keep the amount of the gas supplied constant considering the expansion of the gas. Then, by combining a gas flow rate regulator and a pressure regulator, even when the temperature of the heater varies, the supplying amount of the gas to the reactor vessel and the pressure-resistant vessel can be kept constant and the ambient pressure also can be kept constant. As a result, the evaporation of an alkali metal, an alkaline-earth metal, etc., which have a conspicuous tendency to evaporate, can be suppressed in the reactor vessel, and the minimum gas flow can be controlled optimally. As the gas flow rate regulator and the pressure regulator, conventional ones are available.

In the apparatus of the present invention, the heater is not limited especially, and there are an induction heating type heater (high-frequency coil), a resistance heating type heater (nichrome, kanthal, SiC, $MoSi_2$ heater or the like) and the like. Among them, an induction heating type heater preferably is used, because of reduced amount of impurity gas generated at a high temperature.

Next, as described above, a manufacturing method of the present invention includes the steps of: preparing a crystal raw material solution containing Group III elements, nitrogen and at least one of an alkali metal and an alkaline-earth metal in a reactor vessel, and applying heat and pressure thereto in an atmosphere, of gas containing nitrogen so as to allow the nitrogen and the Group III elements in the crystal raw material solution to react with each other, whereby Group III nitride crystals are grown. The reactor vessel has a gas inlet and a gas outlet, the reactor vessel and a gas supplying device are coupled, and in the reactor vessel, gas containing nitrogen out of gas containing nitrogen introduced through the gas inlet that is not used for the reaction is exhausted through the gas outlet. The manufacturing method of the present invention can be implemented using the manufacturing apparatus of the present invention.

In the manufacturing method of the present invention, preferably, the reactor vessel is stored in a pressure-resistant vessel, the reactor vessel and the gas supplying device are coupled via the gas inlet, and gas containing nitrogen supplied from the gas supplying device firstly is introduced to the reactor vessel through the gas inlet, and then gas containing nitrogen out of gas containing nitrogen introduced that is not used for the reaction is exhausted through the gas outlet to at least one of an inside of the pressure-resistant vessel and an outside of the pressure-resistant vessel.

In the manufacturing method of the present invention, preferably, a flow velocity of the gas containing nitrogen at the gas inlet and the gas outlet of the reactor vessel is 1 cm/sec to 500 cm/sec, for example. More preferably, this is set at 1 cm/sec to 50 cm/sec, and still more preferably is at 2 cm/sec to 10 cm/sec. More preferably; the flow velocity of the gas containing nitrogen at both of the gas inlet and the gas outlet of the reactor vessel is within the above-stated range. The flow velocity of the gas can be adjusted by the first gas flow rate regulator and the second gas flow rate regulator using the apparatus of the present invention having such first gas flow rate regulator and second gas flow rate regulator. Herein, the above-stated flow velocity is a value at an ambient pressure and an ambient temperature in the reactor vessel.

In the manufacturing method of the present invention, preferably, in the reactor vessel, a concentration gradient is formed for at least one of the alkali metal and the alkaline-earth metal evaporating from the crystal raw material solution.

In the manufacturing method of the present invention, preferably, a junction is placed at the gas inlet or at both of the gas inlet and the gas outlet, and the reactor vessel is detachable from the inside of the pressure-resistant vessel. Further, in the manufacturing method of the present invention, a gas open/close mechanism is placed at at least one of the gas inlet and the gas outlet, and the reactor vessel used is detachable from the inside of the pressure-resistant vessel. Preferably, prior to crystal manufacturing, outside of the pressure-resistant vessel, a crystal raw material is put in the reactor vessel in an atmosphere of an inert gas. The gas open/close mechanism is closed and the reactor vessel is hermetically sealed, and the reactor vessel is stored in the pressure-resistant vessel. The reactor vessel is connected to the gas supplying device via the junction, the gas open/close mechanism is opened, and in this state, the gas containing nitrogen is allowed to be introduced to the reactor vessel. Thereby, since the contact of the crystal raw material or the like with the outside-air can be prevented, the oxidation of the alkali metal or the like can be prevented, so that more excellent quality crystals can be obtained. Herein, it is preferable that after putting the crystal raw material in the reactor vessel in an atmosphere of an inert gas outside of the pressure-resistant vessel, the reactor vessel is heated to form the crystal raw material solution. Thereby, at least one of the alkali metal and the alkaline-earth metal and the Group III elements can be made an alloy, and as compared with the case of melting these materials separately, the evaporation of high vapor pressure materials (e.g., the alkali metal and the alkaline-earth metal) can be suppressed. Note here that the inert gas is as described above.

Preferably, the manufacturing method of the present invention further includes the step of performing agitation of the crystal raw material solution. The agitation method of the crystal raw material solution is not limited especially, and the agitation may be performed by utilizing thermal convection generated by heating the bottom of the reactor vessel to a high temperature, or a propeller connected to a rotation motor may be submerged in the crystal raw material solution and the propeller may be rotated for agitation. The material of the propeller is as described above. By heating the crystal raw material solution and concurrently performing agitation, the crystal raw material solution can be made uniform speedily. The agitation by the thermal gradient and the propeller are not limited for during the crystal growth (at a high pressure), but this may be performed at a normal pressure as well (e.g., in a glove box), which is much easier than performing agitation at a high pressure.

Preferably, in the manufacturing method of the present invention, a gas flow rate regulator and a pressure regulator further are provided, and gas containing nitrogen is introduced from the gas supplying device to the reactor vessel via the gas flow rate regulator, and the pressure-resistant vessel has a gas outlet, to which the pressure regulator is connected. Preferably, the gas flow rate regulator and the pressure regulator allow ambient pressure both in the reactor vessel and in the pressure-resistant vessel to be controlled, and the same gas is introduced to the pressure-resistant vessel and to the reactor vessel.

Preferably, in the manufacturing method of the present invention, prior to crystal manufacturing, an impurity gas removal treatment is performed for the reactor vessel and the pressure-resistant vessel. The impurity gas removal treatment is not limited especially, and baking, evacuation, the combination thereof or the like is available for this purpose.

In the apparatus and the manufacturing method of the present invention, a nitrogen source for the nitrogen contained in the crystal raw material solution is not limited especially, and gas containing nitrogen, a nitrogen compound mixed in a raw material solution or the like is available for this purpose. As the nitrogen compound, hydrazine ($H_2NNH_2$), sodium azide and the like are available for example. As the gas containing nitrogen, nitrogen gas, ammonia gas or a mixed gas of these gases is preferable. The gas containing nitrogen may contain an inert gas (e.g., Ar, He and Ne), hydrogen gas and the like. As the nitrogen-containing-gas source, hydrazine may be used. In this case, since hydrazine is split into ammonia and nitrogen at 180° C., the gas obtained by heating hydrazine may be supplied as it is as the gas containing nitrogen, or one obtained by diluting with a carrier gas such as nitrogen ($N_2$) gas and the above-stated inert gas may be supplied for example.

In the apparatus and the manufacturing method of the present invention, preferably, the Group III elements are at least one selected from the group consisting of gallium, aluminum and indium, and the crystals are $Al_xGa_yIn_{1-x-y}N$, wherein $0 \leq x \leq 1$, $0 \leq y \leq 1$, $0 \leq x+y \leq 1$.

In the apparatus and the manufacturing method of the present invention, the alkali metal includes lithium, sodium, potassium, rubidium and cesium, and the alkaline-earth metal includes calcium, magnesium, beryllium, strontium, barium and the like, for example. They may be used alone or in combination of two types or more. Herein, in the present invention, the alkaline-earth metal includes calcium, magnesium, beryllium, strontium and barium. In the apparatus and the manufacturing method of the present invention, the crystal raw material solution may contain silicon (Si), zinc (Zn), magnesium (Mg) or the like as n-type and p-type dopants.

A semiconductor element of the present invention contains Group III nitride crystals manufactured by the manufacturing method of the present invention. A semiconductor light-emitting device of the present invention contains Group III nitride crystals manufactured by the manufacturing method of the present invention.

The following describes apparatuses and manufacturing methods of the present invention more specifically by way of examples. The present invention, however, is not limited to the following examples.

Example 1

FIG. 1 shows the configuration of one example of an apparatus according to the present invention. As illustrated, this apparatus is provided with a gas supplying device 180, a reactor vessel 120, a pressure-resistant vessel 102 and a heater 110. The reactor vessel 120 is stored in the pressure-resistant vessel 102, and a crucible 130 can be placed in the reactor vessel 120. A lid 103 is placed at the top of the pressure-resistant vessel 102 so as to enable hermetic sealing of the pressure-resistant vessel 102. A heat insulator 111 is placed closer to an inner wall of the pressure-resistant vessel 102, and the heater 110 is placed in a space surrounded by this heat insulator 111. The reactor vessel 120 is placed so as to be surrounded by this heater 110. The reactor vessel 120 can be closed at the top with a lid 121. A pipe 122 is connected to the gas supplying device 180, and a gas flow rate regulator 160, a junction 150 and a gas open/close mechanism (valve) 140 are placed along the pipe 122. The leading edge of the pipe 122 is connected to a gas inlet formed at the lid 121 of the reactor vessel 120. Through a gas outlet formed at another part of the lid 121, one end of the other pipe 123 is connected, and a gas open/close mechanism (valve) 141 is placed along this pipe 123. The other end of the pipe 123 is placed inside the pressure-resistant vessel 102. In this example, the configuration including the gas inlet and the pipe 122 connected to the gas inlet is a gas inlet, and the configuration including the gas outlet and the pipe 122 connected to the gas outlet is a gas outlet. An auxiliary heater or the like may be placed along the pipe 123 connected to the gas outlet, the gas open/close mechanism 141 placed along the pipe 123 and the like so that the auxiliary heater heats the pipe 123 and the like to suppress further the aggregation of an alkali metal, an alkaline-earth metals, etc., in the vicinity of the gas outlet. Herein, the crucible 130 used in the present invention is not limited especially, and a crucible is made of a material that is less reactive with Group III elements, alkali metals and alkaline-earth metals, such as alumina, single crystal sapphire, boron nitride (BN), tungsten, tantalum, $Y_2O_3$, CaO or MgO. The crucible 130 is not essential to the present invention, and a raw material of the crystals may be charged into the reactor vessel 120 so as to allow the crystal growth therein. In the case of using the crucible, a lid with micropores for letting gas therein may be placed on the crucible in order to suppress the diffusion of an alkali metal, an alkaline-earth metal, etc., evaporating from the crystal raw material solution.

Figure 5:
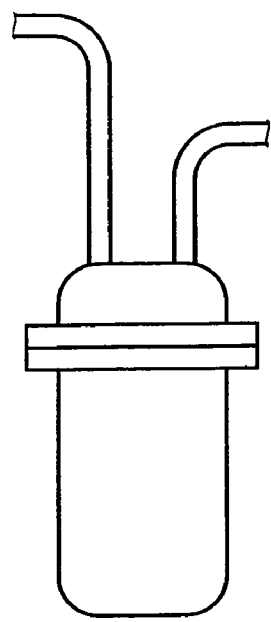
FIG. 5 is a schematic diagram showing one example of the configuration of a reactor vessel of the present invention.
Figure 6:
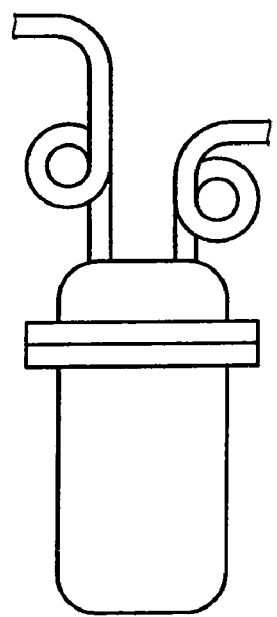
FIG. 6 is a schematic diagram showing another example of the configuration of a reactor vessel of the present invention.

FIG. 5 shows one example of the configuration of the reactor vessel used in the apparatus of the present invention. In FIG. 1, the lengths (heights) of the pipes 122 and 123 connected to the gas inlet and the gas outlet, respectively, are equal to each other. However, as shown in FIG. 5, the pipe connected to the gas outlet may be shorter (lower) than the pipe connected to the gas inlet. With this configuration, the pipe connected to the gas outlet can be brought closer to the heater so that an alkali metal, an alkaline-earth metal, etc., evaporating from the crystal raw material solution can flow therethrough easily, thus preventing the aggregation of the crystal raw material (especially, an alkali metal and an alkaline-earth metal) in the pipe connected to the gas outlet. FIG. 6 is another example of the configuration of the reactor vessel used in the apparatus of the present invention. As illustrated, extra length portions may be provided in the pipes connected to the gas inlet and the gas outlet. The shape, the length and the like of the extra length portions are as described above. The shape of these reactor vessels also applies to the following examples.

Figure 14:
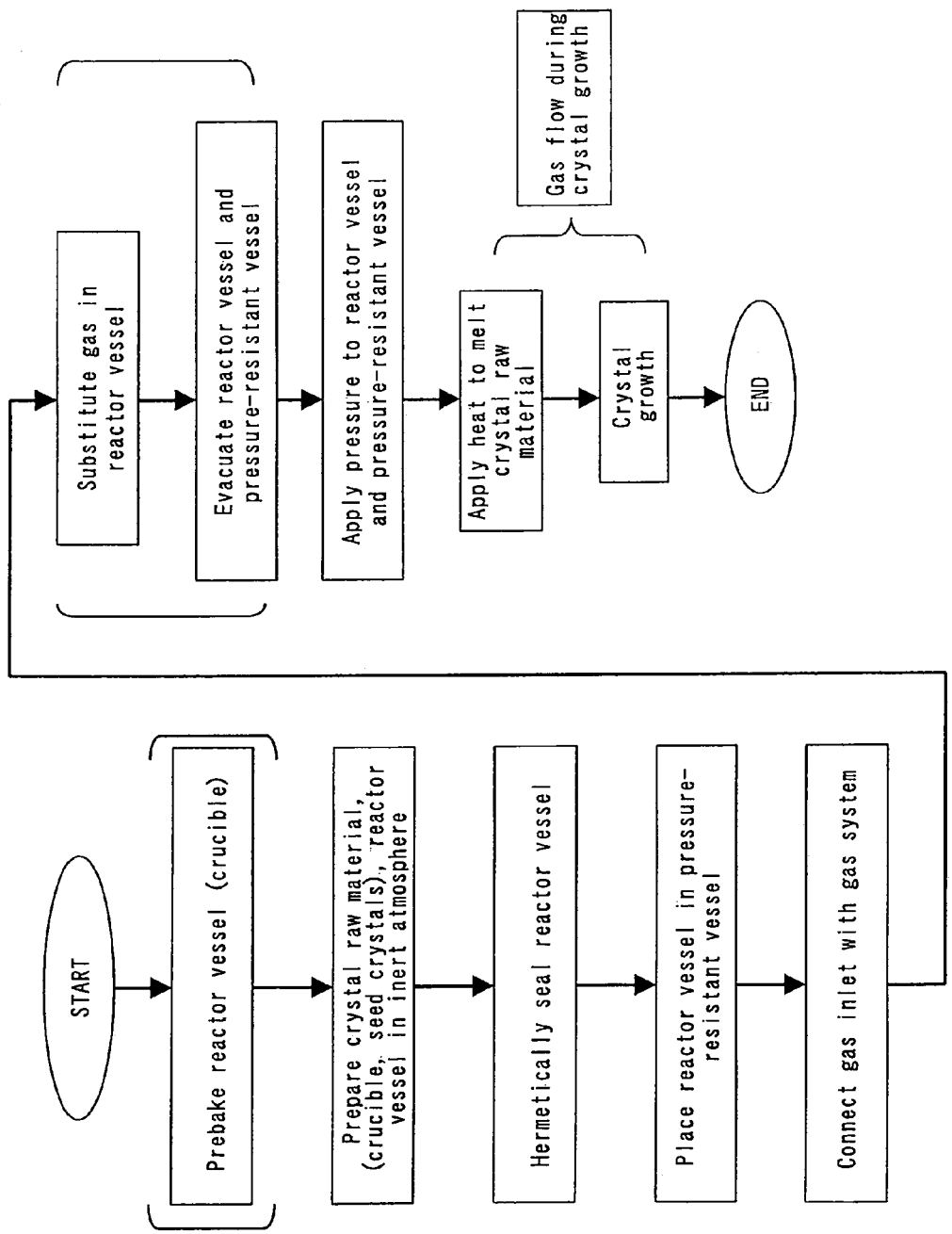
FIG. 14 is a flowchart showing one example of the manufacturing method of the present invention.

The manufacturing method of Group III nitride crystals using the apparatus illustrated in FIG. 1 is described below, based on the flowchart of FIG. 14. This exemplary manufacturing method includes the following six steps:

(1-1) Removal of impurities (this step is optional)
(1-2) Charge of crystal raw material
(1-3) Hermetically sealing of reactor vessel
(1-4) Placement of reactor vessel in pressure-resistant vessel and connection with gas systems (gas inlet side)
(1-5) Control of pressure applied and control of gas flow
(1-6) Crystal growth The following describes these steps more specifically.

(1-1) Removal of Impurities:

As stated above, this step is optional. However, it is preferable to remove impurities from the reactor vessel 120, the crucible 130 or the like by prebaking, evacuation or the like. Herein, instead of using the crucible 130, a crystal raw material 131 may be charged in the reactor vessel 120. The removal of impurities by prebaking or the like preferably is performed prior to the charge of the crystal raw material 131 in the reactor vessel 120 or the like.

(1-2) Charge of Crystal Raw Material:

Next, the crystal raw material 131 is charged in the reactor vessel 120 or the crucible 130. More specifically, desired amounts of Group III elements as the crystal raw material and at least one of an alkali metal and an alkaline-earth metal are weighed, which are then placed in the reactor vessel 120 or the crucible 130. Since the above-stated alkali metal and alkaline-earth metal react with oxygen and water in the air, the disposition preferably is performed in a glove box in which the inside is substituted with an inert gas (rare gas such as helium gas and argon gas, or nitrogen gas, etc.). Then, the reactor vessel 120 or the crucible 130 is heated, so as to form a melt containing the above-stated Group III elements and at least one of the alkali metal and the alkaline-earth metal. At this time, it is preferable to perform agitation of the melt. The agitation method of the melt is as described above. The agitation of the melt may be performed in a glove box or performed in the pressure-resistant vessel after the hermetically sealing of the reactor vessel and the placement of the reactor vessel in the pressure-resistant vessel, which will be described later. However, various steps of the agitation operation in the glove box (normal pressure) are much easier than in the pressure-resistant vessel (under high pressure). Further, as required, seed crystals may be provided at the same time in the reactor vessel 120 or the crucible 130. A Group III nitride crystal thin film by vapor phase growth may be used for example as the seed crystals. It is preferable that the seed crystals are immersed in the melt after the agitation of the melt. For instance, the seed crystals may be placed while tilting the reactor vessel 120 or the crucible 130 so that the seed crystals are not immersed in the melt, whereby the seed crystals will not be immersed in the melt until the agitation of the melt is completed.

(1-3) Hermetically Sealing of Reactor Vessel:

The reactor vessel 120 is covered with the lid 121. At this time, as required, a screw or a gasket may be used. Further, the above-stated two gas open/close mechanisms (valves 140, 141) are dosed in a glove box (e.g., dew point inside the glove box: −80° C. or less), whereby the reactor vessel 120 becomes a hermetically sealed state.

(1-4) Placement of Reactor Vessel in Pressure-Resistant Vessel and Connection with Gas Systems (Gas Inlet Side):

Next, the reactor vessel 120 is placed in the pressure-resistant vessel 102, and the reactor vessel 120 and the gas supplying device 180 are connected via the junction 150. In this state, the gas open/dose mechanism (valve) 140 on the gas inlet side is opened, so as to introduce gas containing nitrogen into the reactor vessel 120. Then, when the pressure in the reactor vessel 120 is somewhat higher than a normal pressure, the gas open/dose mechanism (valve) 141 on the gas outlet side is opened, thereby substituting the inside of the reactor vessel 120 with the gas containing nitrogen while exhausting the gas containing nitrogen into the pressure-resistant vessel 102. Then, the gas containing nitrogen filling the pressure-resistant vessel 102 is exhausted to the outside via the pipe connected to the gas outlet. At this time, the gas flows through the gas supplying device 180, the reactor vessel 120 and the pressure-resistant vessel 102 in this order, so that impurities in the pressure-resistant vessel 102 such as the inner wall will not get mixed in the reactor vessel 120. Further, this prevents the outside-air from flowing into the reactor vessel 120. At the beginning of the introduction of the gas containing nitrogen, the pressure-resistant vessel 102 may be covered with the lid 103. Note here that prior to this introduction of the gas containing nitrogen or at the time of the introduction of the gas containing nitrogen, the pressure-resistant vessel 102 may be evacuated using a vacuum pump or the like. During the evacuation of the pressure-resistant vessel 102, gas may be allowed to flow in the reactor vessel 120 in a degree of preventing the backflow of the air. When the air of the pressure-resistant vessel 102 is exhausted sufficiently, the introduction of the gas containing nitrogen from the gas inlet is suspended, and the pressure-resistant vessel 102 is evacuated to a higher vacuum. Thereby, impurity gas such as oxygen and water attached to the heater 110, the heat insulator 111 and the inner wall of the pressure-resistant vessel 102 can be removed.

(1-5) Control of Pressure Applied and Control of Gas Flow

Next, pressure is applied to the inside of the pressure-resistant vessel 102 with the gas containing nitrogen. As described above, the gas containing nitrogen flows through the reactor vessel 120 to the pressure-resistant vessel 102, and therefore the pressure inside the reactor vessel 120 also can be regulated with one pressure regulator 170 attached to the pressure-resistant vessel 102. Also, one gas flow regulator 160 will suffice. When a predetermined pressure is achieved, the pressure inside the pressure-resistant vessel 102 is kept constant using the pressure regulator 170. At this time, since the pressure inside the reactor vessel 120 and the pressure inside the pressure-resistant vessel 102 become substantially equal to each other, the reactor vessel 120 does not require a pressure-resistant property. Thus, there is no need to use a reactor vessel made of an expensive pressure-resistant material, and generally available SUS, alumina and the like, which are at a low cost, can be used. The pressure in the reactor vessel and the pressure-resistant vessel is in the range of 2 atm to 100 atm ($2 \times 1.01325 \times 10^5$ Pa to $100 \times 1.01325 \times 10^5$ Pa) for example, preferably in the range of 5 atm to 80 atm ($5 \times 1.01325 \times 10^5$ Pa to $80 \times 1.01325 \times 10^5$ Pa), and more preferably in the range of 10 atm to 60 atm ($10 \times 1.01325 \times 10^5$ Pa to $60 \times 1.01325 \times 10^5$ Pa).

(1-6) Crystal Growth

Next, the reactor vessel 120 is heated to a desired temperature (growth temperature) by the heater 110, whereby a crystal raw material solution is formed in the reactor vessel 120. The growth temperature for example is in the range of 600° C. to 1,100° C., preferably in the range of 700° C. to 1,000° C. and more preferably in the range of 800° C. to 950° C. Herein, the gas containing nitrogen does not flow by way of the pressure-resistant vessel 102 but is introduced directly to the reactor vessel 120. Therefore, the influence of contamination by the impurity gas generated from the heater 110 and the heat insulator 111 inside the pressure-resistant vessel 102 can be eliminated. Further, the regulation of the flow rate of the gas containing nitrogen by the gas flow regulator 160 prevents the impurity gas from flowing (back-flow) into the reactor vessel 120. The flow rate of the gas containing nitrogen is for example in the range of 10 mL/min. to 1,000 mL/min. in terms of 1 atm ($1 \times 1.01325 \times 10^5$ Pa) (standard state), preferably in the range of 20 mL/min. to 300 mL/min. and more preferably in the range of 50 mL/min. to 200 mL/min.

With this process, Group III nitride crystals with a diameter of 1 inch to 2 inch (2.54 cm to 5.08 cm) and a thickness of 0.5 mm to 2 mm, for example, can be grown with good reproducibility and high quality.

Example 2

Figure 4:
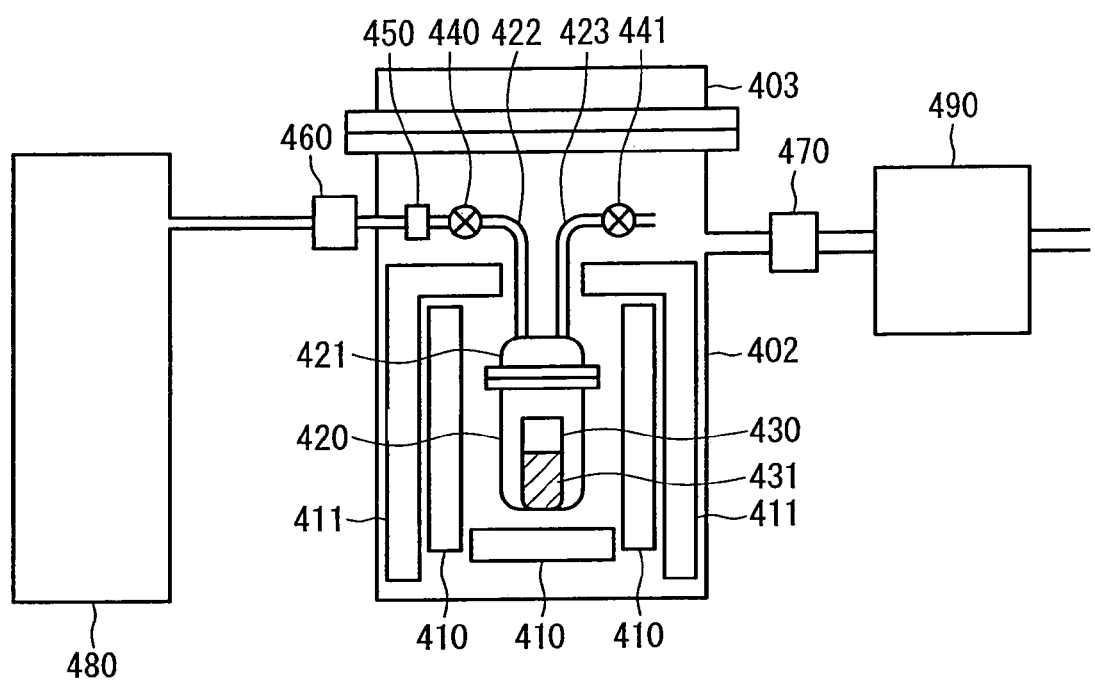
FIG. 4 is a schematic diagram showing a further example of the configuration of a crystal manufacturing apparatus of the present invention.

Next, another example of the configuration of an apparatus of the present invention is shown in FIG. 4. As illustrated in this drawing, this apparatus has the same configuration as that of the apparatus shown in FIG. 1 except that a recovery device 490 is connected to a pressure regulator 470. The manufacturing method using this apparatus also is the same as in the above. In this example, since the recovery device is provided, emission of an alkali metal, an alkaline-earth metal, etc., evaporating from the crystal raw-material solution to the air outside of the apparatus can be prevented. In FIG. 4, numeral 480 denotes a gas supplying device, 460 denotes a gas flow rate regulator, 450 denotes a junction, 440 and 441 denote gas open/close mechanisms (valves), 402 denotes a pressure-resistant vessel, 403 denotes a lid of the pressure-resistant vessel 402, 420 denotes a reactor vessel, 421 denotes a lid of the reactor vessel 420, 430 denotes a crucible, 410 denotes a heater and 411 denotes a heat insulator.

Example 3

Figure 2:
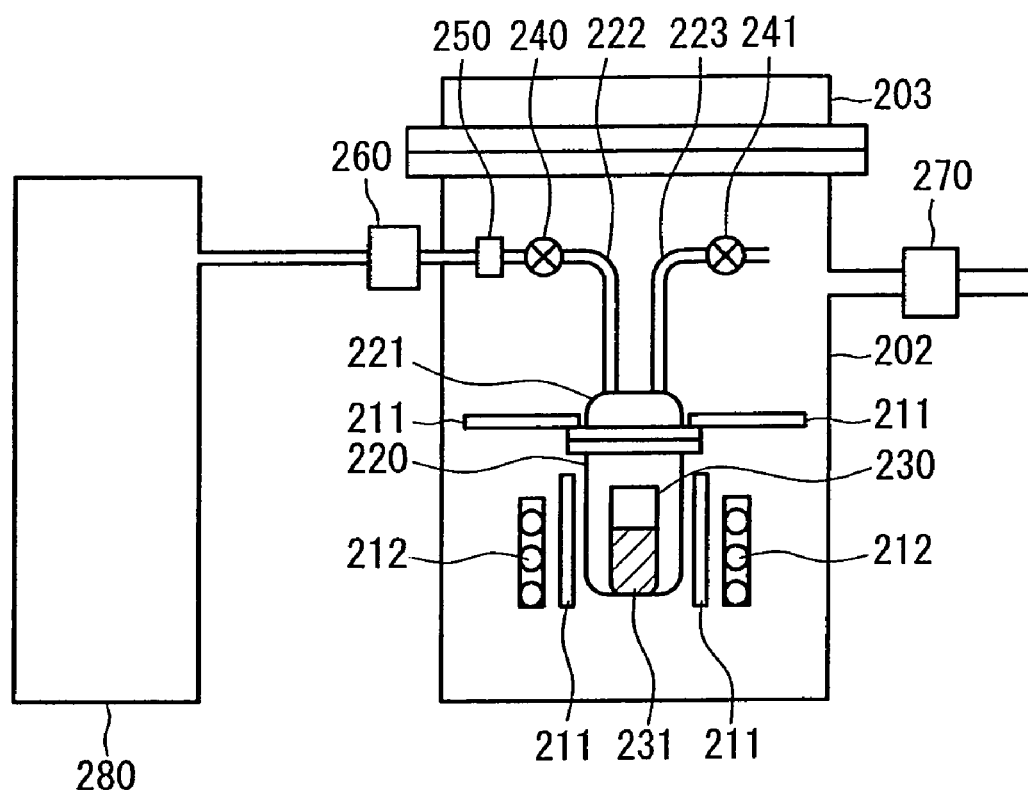
FIG. 2 is a schematic diagram showing the configuration of another example of a crystal manufacturing apparatus of the present invention.

Next, still another example of the configuration of an apparatus of the present invention is shown in FIG. 2. The apparatus of this example has the same configuration as that of the apparatus shown in FIG. 1 except that a high-frequency heater is used as the heater and the arrangement of the heat insulator is changed correspondingly in the above-stated apparatus of Example 1. The manufacturing method using this apparatus also is the same as in the above. As shown in FIG. 2, in this apparatus, a heat insulator 211 is placed around a reactor vessel 220, which is surrounded by a high-frequency heater 212. Since the high-frequency heater 212 is used, a ceramic material such as alumina may be used for the reactor vessel 220 and a conductive metal such as tungsten or tantalum may be used as a crucible 230, whereby heat can be applied to portions to be heated effectively. Further, according to this example, since heat is applied to the crucible 230 and a crystal raw material 231 only, the heat insulator can be made thinner. Therefore, impurity gas from the high-frequency heater 212 and the heat insulator 211 can be minimized, and as compared with Example 1, higher purity crystals can be grown. In FIG. 2, numeral 280 denotes a gas supplying device, 260 denotes a gas flow rate regulator, 270 denotes a pressure regulator, 250 denotes a junction, 240 and 241 denote gas open/close mechanisms (valves), 202 denotes a pressure-resistant vessel, 203 denotes a lid of the pressure-resistant vessel 202 and 221 denotes a lid of the reactor vessel 220. In this example also, a recovery device may be connected to the pressure regulator 270 as shown in Example 2.

Example 4

Figure 3:
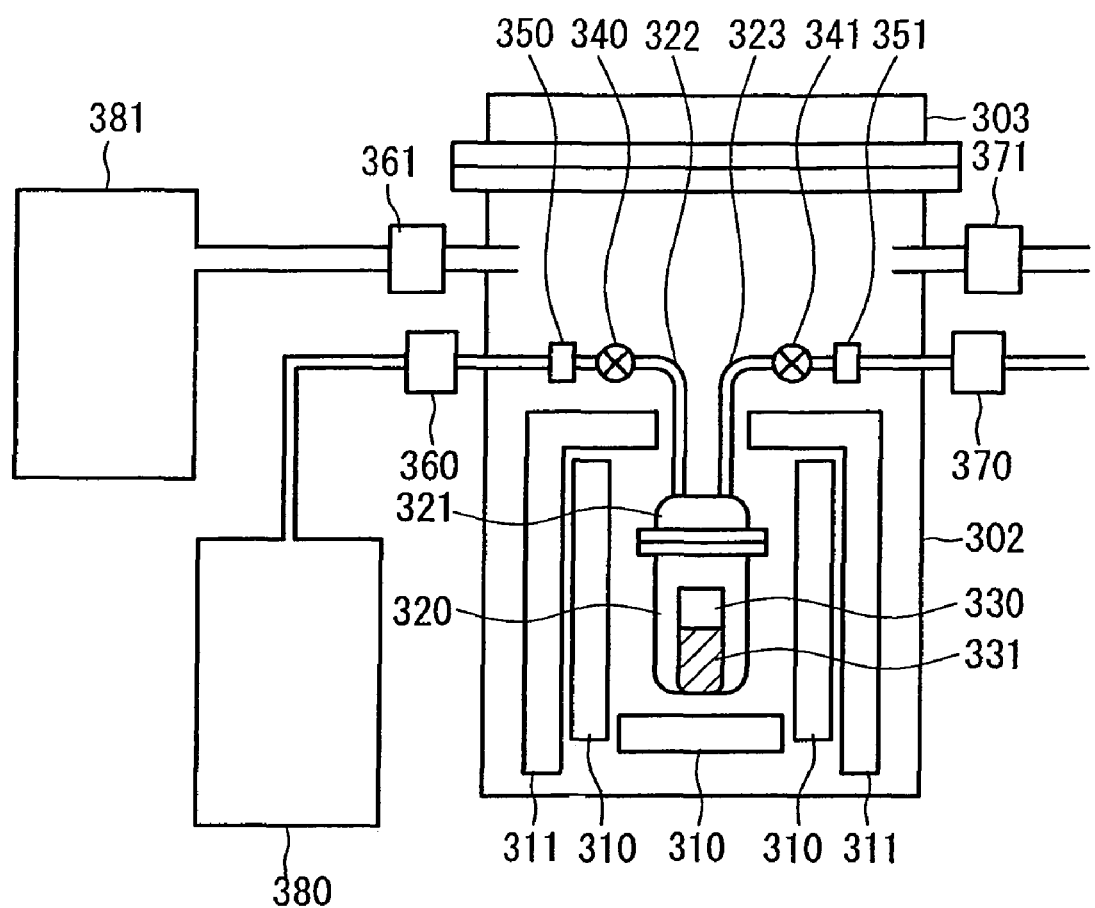
FIG. 3 is a schematic diagram showing the configuration of still another example of a crystal manufacturing apparatus of the present invention.

Next, a further example of the configuration of an apparatus of the present invention is shown in FIG. 3. The apparatus of this example is provided with a second gas supplying device 381, a second gas flow rate regulator 361, a second pressure regulator 371 and a junction 351 in addition to the apparatus shown in FIG. 1. This apparatus is different from the apparatus shown in FIG. 1 in the following configuration. A pipe 323 connected to a gas outlet formed at a lid 321 of a reactor vessel 320 is connected to a first pressure regulator 370 via the junction 351, so as to communicate directly with the outside of the pressure-resistant vessel 302. The pressure-resistant vessel 302 has a gas inlet and a gas outlet, and the second gas supplying device 381 is connected to the gas inlet of the pressure-resistant vessel 302 via the second gas flow rate regulator 361. The gas outlet of the pressure-resistant vessel 302 is connected to the second pressure regulator 371. Note here that in this example the provision of the gas outlet at the pressure-resistant vessel is optional, and the configuration without the gas outlet and the second pressure regulator 371 shown in FIG. 3 also is possible. In this case, a pressure regulator with a leak function can be used as the second gas flow rate regulator 361. In this example, the recovery device shown in Example 2 may be connected to the first pressure regulator 370. In FIG. 3, numeral 380 denotes a first gas supplying device, 360 denotes a first gas flow rate regulator, 350 denotes a junction, 340 and 341 denote gas open/close mechanisms (valves), 303 denotes a lid of the pressure-resistant vessel 302, 330 denotes a crucible, 310 denotes a heater and 311 denotes a heat insulator. This example allows pressure to be controlled independently between the reactor vessel 320 and the pressure-resistant vessel 302. Thus, during the placement of the reactor vessel 320 into the pressure-resistant vessel 302 and during the crystal growth, an operation for the growth can be conducted while keeping the inside of the reactor vessel 320 as a gas system completely separated from the pressure-resistant vessel 302.

Figure 15:
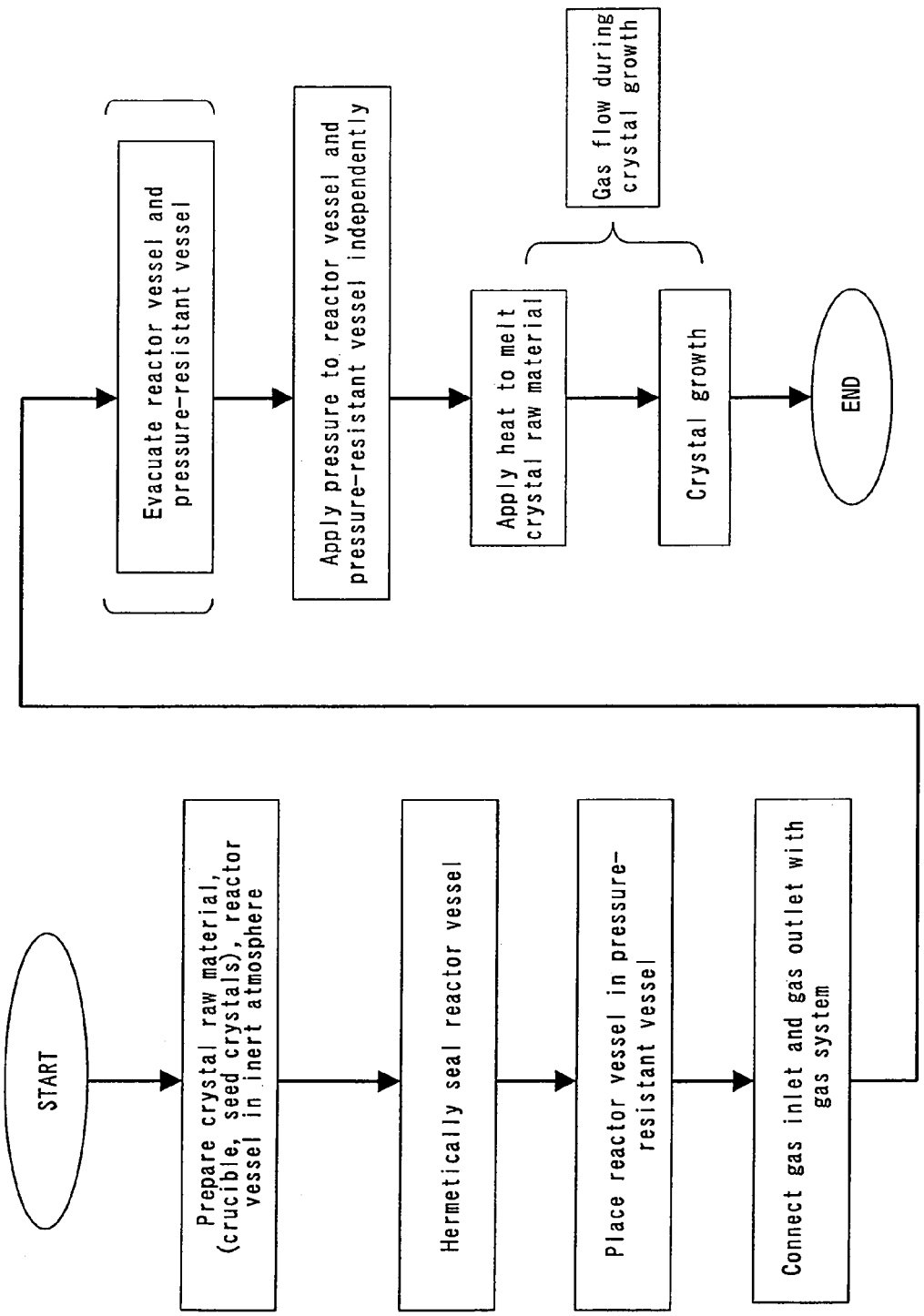
FIG. 15 is a flowchart showing another example of the manufacturing method of the present invention.

The manufacturing of crystals using this apparatus is described below, based on the flowchart of FIG. 15. This exemplary manufacturing method includes the following six steps:

(3-1) Removal of impurities (this step is optional)
(3-2) Charge of crystal raw material
(3-3) Hermetically sealing of reactor vessel
(3-4) Placement of reactor vessel in pressure-resistant vessel and connection with gas systems (gas inlet side and gas outlet side)
(3-5) Control of pressure applied to reactor vessel and pressure-resistant vessel independently and control of gas flow
(3-6) Crystal growth Among the above-stated steps, the steps of (3-1) to (3-3) are the same as the steps (1-1) to (1-3) of Example 1. Therefore, the steps (3-4) to (3-6) are described-below.

(3-4) Placement of Reactor Vessel in Pressure-Resistant Vessel and Connection with Gas Systems (Gas Inlet Side and Gas Outlet Side)

The reactor vessel 320 is placed in the pressure-resistant vessel 302. The reactor vessel 320 and the first gas supplying device 380 are connected via the junction 350, and the reactor vessel 320 and the first pressure regulator 370 are connected via the other junction 351. In this state, similarly to Example 1, gas is introduced into the reactor vessel 320. Note here that prior to this introduction of the gas or at the time of the introduction of the gas, the gas open/close mechanism (valve) 340 on the gas inlet side and the gas open/close mechanism (valve) 341 on the gas outlet side are opened so as to evacuate the reactor vessel once, which is for exhausting impurity gas from pipes.

(3-5) Control of Pressure Applied to Reactor Vessel and Pressure-Resistant Vessel Independently and Control of Gas Flow Next, pressure is applied to the inside of the reactor vessel 320 with gas containing nitrogen supplied from the first gas supplying device 380, and pressure is applied to the inside of the pressure-resistant vessel 302 with gas supplied from the second gas supplying device 381. The pressure in the reactor vessel 320 is controlled by the combination of the first gas flow rate regulator 360 and the first pressure regulator 370, and the pressure in the pressure-resistant vessel 302 is controlled by the combination of the second gas flow rate regulator 361 and the second pressure regulator 371, and they are controlled independently. At this time, the pressure in the reactor vessel 320 and the pressure in the pressure-resistant vessel 302 may be equal to or different from each other. If the pressure in the pressure-resistant vessel 302 is higher the pressure in the reactor vessel 320, the sealing property of the reactor vessel 320 is improved. If the pressure in the reactor vessel 320 and the pressure in the pressure-resistant vessel 302 are controlled to be substantially equal to each other, the reactor vessel 320 does not require a significant pressure-resistant property. The pressure in the reactor vessel 320 and the pressure in the pressure-resistant vessel 302 are similar to Example 1.

(3-6) Crystal Growth

Next, similarly to Example 1, crystals are grown. During the crystal growth, a desired flow rate of gas containing nitrogen is allowed to flow continuously in the reactor vessel 320. Thereby, a high purity gas containing nitrogen can be supplied always to a crystal raw material without influences of impurity gas attached to the wall of the reactor vessel 320 and the like. As a result, a high purity crystal raw material solution can be maintained. At this time, as for the gas containing nitrogen, a high purity gas can be used only for the inside of the reactor vessel 320, which can be independent of the purity and types of the gas in the pressure-resistant vessel 302. For instance, argon gas with a purity of 99% or nitrogen gas with a purity of 99%, etc, can be used for the gas introduced into the pressure-resistant vessel 302 from the second gas supplying device 381, whereas a high purity gas with a purity of about 99.9% to 99.99999% can be used for the gas containing nitrogen introduced into the reactor vessel 320 from the first gas supplying device 380. In this case, the size of the reactor vessel 320 may be somewhat larger than the size of crystals to be grown, which can be significantly smaller than the pressure-resistant vessel 302, thus leading to the feature of reducing the consumption amount of expensive high-purity gas. Further, as the gas introduced into the pressure-resistant vessel 302, gas such as argon may be used, for example, whereby the reactor vessel 320 even made of a stainless steel vessel at a low cost can be free from rust. Further, in the case where the reactor vessel 320 is made of a material resistant to oxidizing even at a high temperature such as nickel alloy (e.g., Inconel and hastelloy), the gas introduced into the pressure-resistant vessel 302 may be the air. In this example, the gas system introduced into the reactor vessel 320 and the gas system introduced into the pressure-resistant vessel 302 should be controlled independently concerning the pressure and the flow rate, and therefore the control of gas may become complicated to some degree. However, as described above, a high purity gas can be used only for the gas introduced into the reactor vessel 320, thus resulting in the reduction of a running cost of the apparatus. Further, in the case where gas containing oxygen (e.g., the air) is used as the gas in the pressure-resistant vessel, a molybdenum-based heater ($MoSi_2$ heater or the like), which can be used at a very high temperature even with resistance heating, is available, thus leading to the feature of being advantageous in the crystal growth of AlN based materials especially.

With these steps, in the case where 99.9% nitrogen gas is used as the gas introduced into the pressure-resistant vessel 302, a stainless steel vessel is used as the reactor vessel 320 and alumina is used as the crucible 330, Group III nitride crystals with a thickness of about 1 mm can be grown on a template with a diameter of 1 inch to 2 inch (2.54 cm to 5.08 cm) at a pressure of 40 atm ($40 \times 1.03125 \times 10^5$ Pa) in the reactor vessel 302 and the pressure-resistant vessel 302 and a growth temperature of 800° C. for a growth time of 100 hours, for example.

Example 5

Figure 7A:
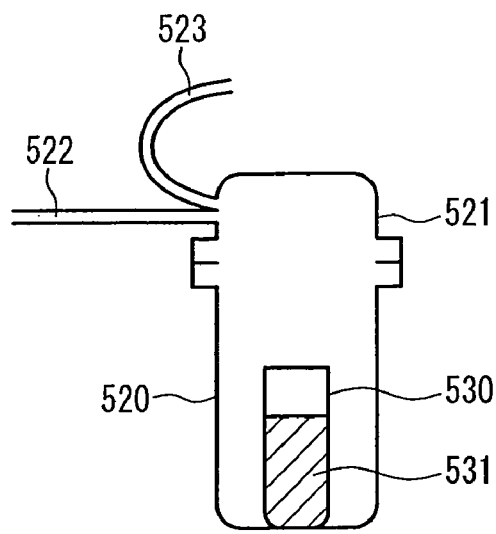
FIG. 7A is a schematic diagram showing still another example of the configuration of a reactor vessel of the present invention.
Figure 7B:
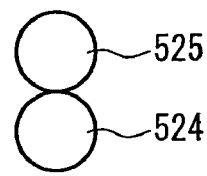
FIGS. 7B and 7C are schematic diagrams showing examples of the configuration of a gas inlet and gas outlet in the reactor vessel of the present invention.
Figure 7C:
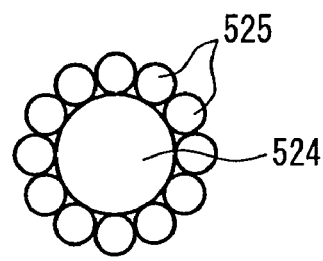

FIG. 7A shows another example of the configuration of the reactor vessel used in the apparatus of the present invention. As illustrated in this drawing, a reactor vessel 520 can be closed at the top with a lid 521. A crucible 530 can be placed in the reactor vessel 520 and a crystal raw material solution 531 can be put in the crucible 530. A gas inlet and a gas outlet are formed at the lid 521 to be adjacent to each other, to which a pipe 522 and a pipe 523 are connected, respectively. In this way, by forming the gas outlet adjacent to the gas inlet, gas can be exhausted from a region having a low concentration of an alkali metal, an alkaline-earth metal, etc., in the reactor vessel, thus further suppressing the evaporation of the alkali metal, the alkaline-earth metal, etc., from the crystal raw material solution. FIGS. 7B and C are cross-sectional views of the pipes in the vicinity of the reactor vessel, which are examples of the configuration of the gas inlet and the gas outlet. FIG. 7B shows one example of the configuration in which a gas inlet 524 and a gas outlet 525 are formed adjacent to each other, and FIG. 7C shows one example of the configuration in which a plurality of gas outlets 525 are formed adjacent to the perimeter of the gas inlet 524.

Figure 8:
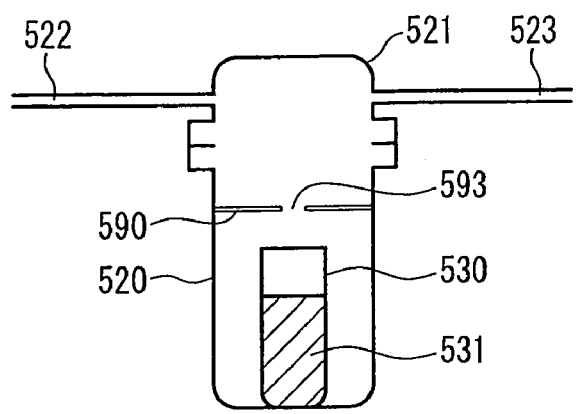
FIG. 8 is a schematic diagram showing a further example of the configuration of a reactor vessel of the present invention.

FIG. 8 shows still another example of the configuration of the reactor vessel used in the apparatus of the present invention. In this drawing, the same numerals are assigned to the same elements as in FIG. 7A. As shown in this drawing, a baffle plate 590 is placed inside a reactor vessel 520 and over a crucible 530. A through hole 593 is formed at the center portion of the baffle plate 590. A gas inlet and a gas outlet are formed to face each other in a lid 521, and pipes 522 and 523 are connected to the gas inlet and the gas outlet, respectively. This configuration further can suppress the evaporation of an alkali metal, an alkaline-earth metal, etc., from the crystal raw material solution. As a result, the emission of vapor of the alkali metal, the alkaline-earth metal, etc., to the outside of the reactor vessel can be reduced. Although the baffle plate is placed in the reactor vessel 520 in this example, this is not a limiting example, and the baffle plate may be placed in the lid 521. Further, as described above, instead of or in addition to the baffle plate, a lid with micropores for letting gas pass through may be placed over the crucible.

Figure 9:
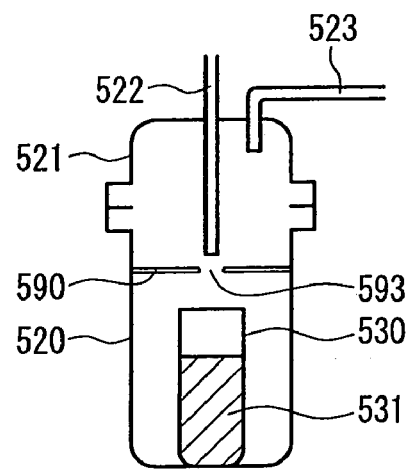
FIG. 9 is a schematic diagram showing a still further example of the configuration of a reactor vessel of the present invention.
Figure 10:
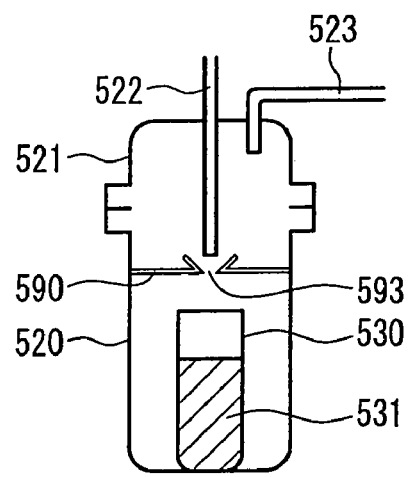
FIG. 10 is a schematic diagram showing another example of the configuration of a reactor vessel of the present invention.

FIGS. 9 and 10 show further examples of the configuration of the reactor vessel used in the apparatus of the present invention. In these drawings, the same numerals are assigned to the same elements as in FIG. 8. As shown in FIG. 9, a gas inlet and a gas outlet are formed at the top wall face of a lid 521, to which pipes 522 and 523 are connected respectively. One end of the pipe 522 connected to the gas inlet is placed closer to a through hole 593 formed at the center portion of a baffle plate 590. This configuration further can suppress the evaporation of an alkali metal, an alkaline-earth metals, etc., from the crystal raw material solution. The shape of the through hole 593 in the baffle plate 590 is not limited especially, and for example, as shown in FIG. 10, a taper shape that widens gradually toward the gas inlet side is possible.

In the case where the reactor vessel shown in FIG. 8 is used, GaN crystals can be manufactured as in the following, for example. Firstly, a rector vessel with a gas inlet and a gas outlet whose inner diameters are 2 mmΦ is prepared. Then, metals of Na and Ga (total weight: 28 g) and GaN (2 inch, thickness of seed layer: 5 μm), which is grown as seed crystals by vapor phase growth on a sapphire substrate, are placed in the crucible 530. The crucible 530 is placed in the reactor vessel 520, to which heat is applied by the heater and pressure is applied, so as to grow crystals under the following conditions, for example:

flow rate of gas containing nitrogen (standard state): 100 mL/min.

crystal growth temperature: 850° C.

pressure during crystal growth: 40 atm ($40 \times 1.01325 \times 10^5$ Pa)

gas flow velocity at the gas inlet and the gas outlet (850° C. and 40 atm ($40 \times 1.01325 \times 10^5$ Pa)): 5 cm/sec.

As a result of the crystal growth for 96 hours, GaN crystals with a thickness of 1 mm to 3 mm and with a low degree of dislocation can be obtained, and the evaporation of an alkali metal, an alkaline-earth metal, etc., can be suppressed within the range of about 1 to 10%. Further, according to the apparatus of the present invention, there is no aggregation of the alkali metal, the alkaline-earth metal, etc., at the gas inlet and the gas outlet and in the pipes connected thereto, and impurity gas (e.g., oxygen and water) from the heater and the heat insulator outside of the reactor vessel does not enter into the reactor vessel, thus allowing high quality crystals to be grown.

Example 6

Figure 11:
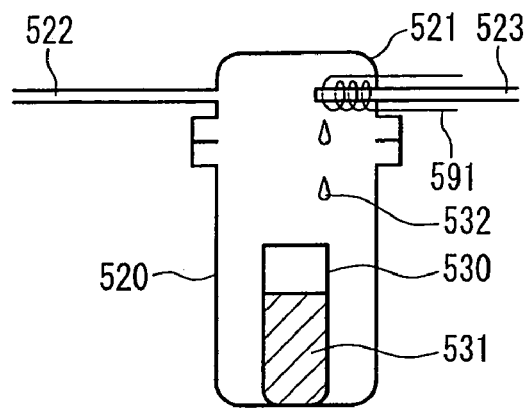
FIG. 11 is a schematic diagram showing still another example of the configuration of a reactor vessel of the present invention.
Figure 12:
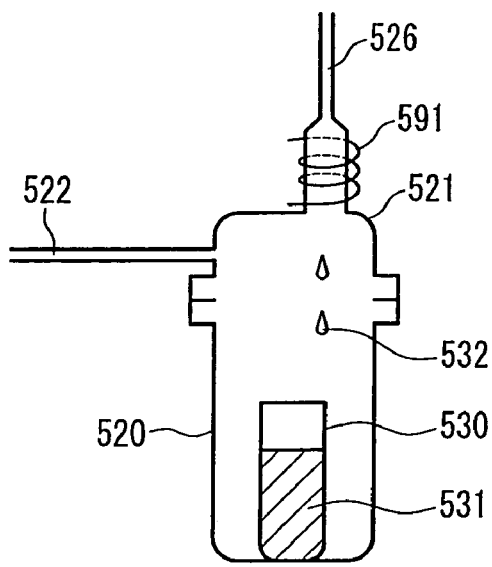
FIG. 12 is a schematic diagram showing a further example of the configuration of a reactor vessel of the present invention.
Figure 13:
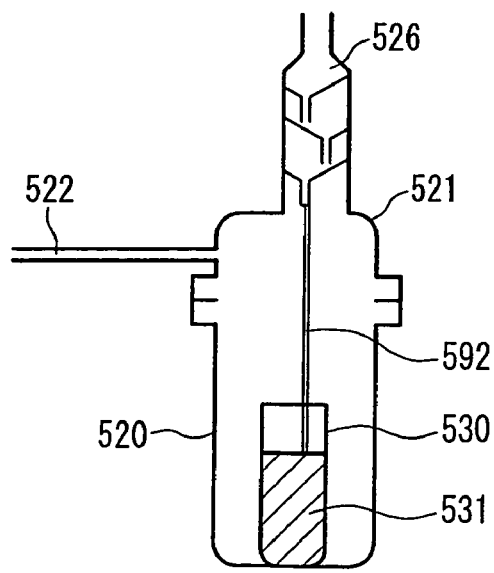
FIG. 13 is a schematic diagram showing a still further example of the configuration of a reactor vessel of the present invention.

FIGS. 11 to 13 show still further examples of the configuration of the reactor vessel used in the apparatus of the present invention. In these drawings, the same numerals are assigned to the same elements. As shown in FIG. 11, a reactor vessel 520 can be dosed at the top with a lid 521. A crucible 530 can be placed in the reactor vessel 520 and a crystal raw material solution 531 can be put in the crucible 530. A gas inlet and a gas outlet are formed in the lid 521 so as to face each other, to which a pipe 522 and a pipe 523 are connected, respectively. The pipe 523 connected to the gas outlet is connected so as to penetrate through the gas outlet, and one end thereof is placed in the reactor vessel 520. A cooling tube 591 is brought close to or in contact with and is wound around the portion of the pipe 523 placed in the reactor vessel 520, thus cooling the pipe 523. With this configuration, the vapor such as an alkali metal evaporating in the vicinity of the gas outlet can be cooled to be droplets 532, which then can be recovered (liquefied) and reused as a crystal raw material solution.

In the further example of the configuration of the reactor vessel shown in FIG. 12, a gas outlet is placed at a top wall face of a lid 521, and a pipe (also called gas exhaustion tube) 526 connected to the gas outlet has a funnel shape. This funnel shape of the gas outlet pipe 526 whose inner diameter is made larger on the reactor vessel side can prevent the clogging of the alkali metal, the alkaline-earth metals, etc., which evaporate and then are liquefied, in the gas exhaustion tube and further can reduce the evaporation of the alkali metal, the alkaline-earth metal, etc.

In the further example of the configuration of the reactor vessel shown in FIG. 13, a drops guide 592 further is provided, and one end of the drops guide 592 is placed in a gas exhaustion tube 526 and the other end is placed in the crystal raw material solution 531 or closer to the liquid surface. The internal structure of the gas exhaustion tube includes funnel structures stacked as a multistage in which the funnel structures have centers displaced from each other. Similarly to FIG. 12, a cooling tube is placed closer to or in contact with the gas exhaustion tube 526 (not illustrated). Such a drops guide allows the liquefied alkali metal, alkaline-earth metal, etc., to be returned quietly without disturbing the crystal raw material solution in the crucible.

The apparatus of the present invention is not limited to these examples, and for example, the configuration provided with both of the baffle plate and the gas exhaustion tube also is possible.

Example 7

Figure 16:
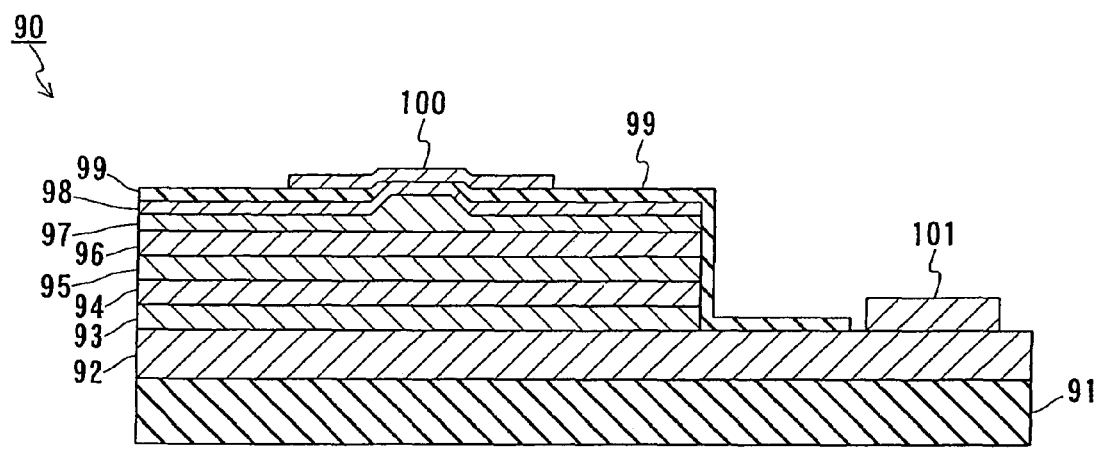
FIG. 16 is a schematic cross-sectional view showing one example of a semiconductor element that uses crystals obtained by the manufacturing method of the present invention.
Figure 17:
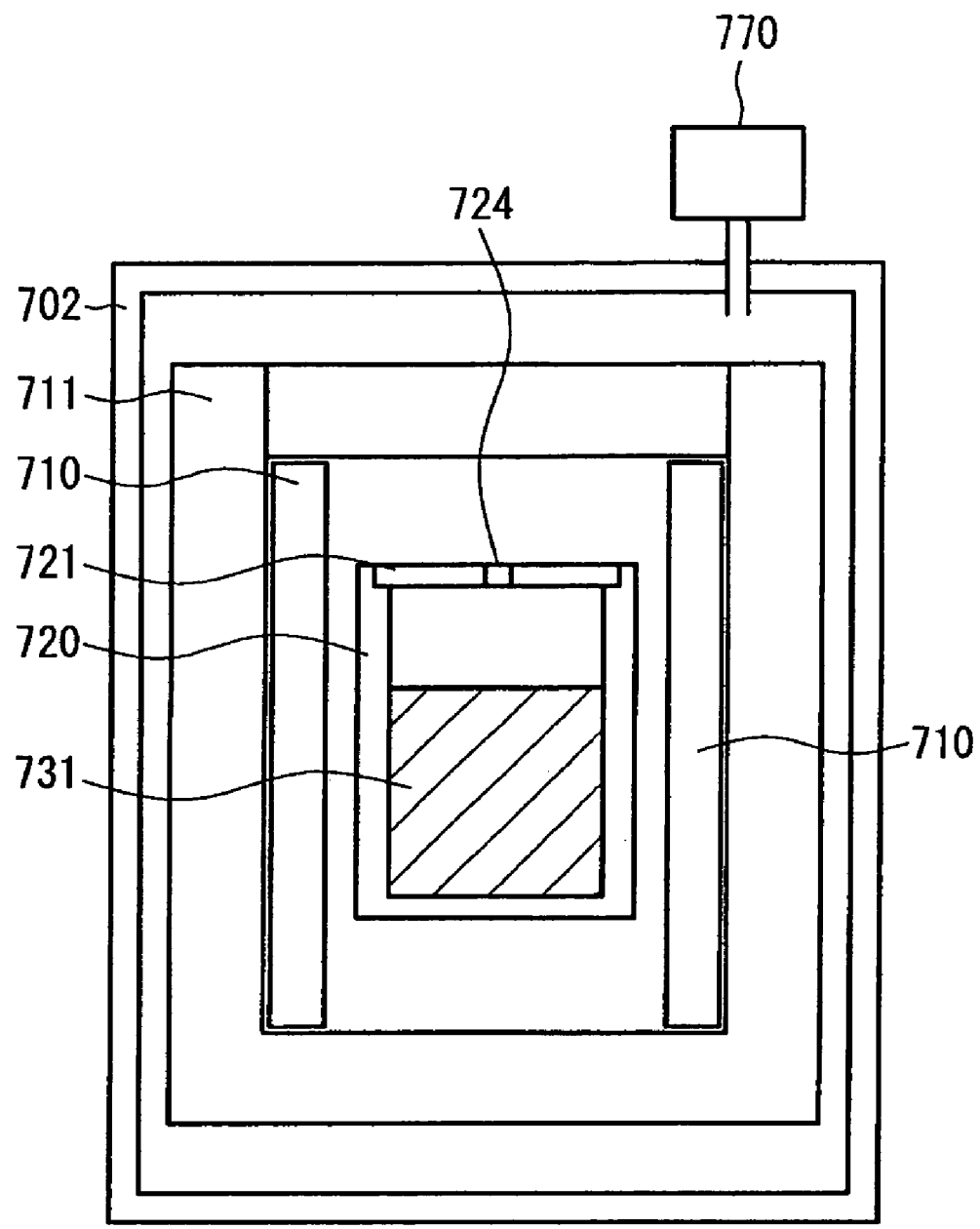
FIG. 17 is a schematic diagram showing one example of the configuration of a conventional crystal growth apparatus.

The following describes a semiconductor element of the present invention. The semiconductor element includes a substrate containing Group III nitride crystals obtained by the manufacturing method using the apparatus of the present invention. FIG. 16 shows an exemplary configuration of a semiconductor element 90 of the present invention.

First, on a substrate 91 including Group III nitride crystals obtained by the manufacturing method of the present invention is formed a contact layer 92 of n-type GaN doped with Si to have a carrier density of $5 \times 10^{18}$ or lower. In GaN-based crystals (crystals containing Ga and N), when Si is added thereto as an impurity, holes present in Ga increase in number. Since the holes present in Ga diffuse easily, they adversely affect in terms of, for example, lifetime when a device is formed on the contact layer. Hence, the doping amount may be controlled so that the contact layer has a carrier density of $5 \times 10^{18}$ or lower.

Next, on the contact layer 92 are formed a cladding layer 93 of n-type $Al_{0.07}Ga_{0.93}N$ and a light guiding layer 94 of n-type GaN. Subsequently, as an active layer 95 is formed a multiple quantum well (MQW) composed of a well layer (with a thickness of about 3 nm) made of $Ga_{0.8}In_{0.2}N$ and a barrier layer (with a thickness of about 6 nm) made of GaN. Thereafter, on the active layer 95 are formed sequentially a light guiding layer 96 of p-type GaN, a cladding layer 97 of p-type $Al_{0.07}Ga_{0.93}N$, and a contact layer 98 of p-type GaN. These layers can be formed by well-known methods. The semiconductor element 90 is a semiconductor light-emitting device of a double-hetero junction type. The energy gap of the well layer containing indium in the MQW active layer 95 is smaller than those of the n-type and p-type cladding layers containing aluminum. On the other hand, the highest optical refractive index is obtained in the well layer of the active layer 95, followed by the light guiding layers and the cladding layers having optical refractive indices decreasing in this order.

On the contact layer 98 is formed an insulation film 99 forming a current injection region having a width of about 2 μm. A ridge part to serve as a current constriction part is formed in the p-type contact layer 98 and in the upper portion of the p-type cladding layer 97. On the upper side of the p-type contact layer 98 is formed a p-side electrode 100 that is in ohmic contact with the contact layer 98. The p-side electrode 100 may be formed of a lamination of nickel (Ni) and gold (Au). On the n-type contact layer 92 is formed an n-side electrode 101 that is in ohmic contact with the contact layer 92. The n-side electrode 101 may be formed of a lamination of titanium (Ti) and aluminum (Al).

The semiconductor light-emitting device produced by the method described above was subjected to a device evaluation. When a predetermined forward voltage is applied between the p-side electrode and the n-side electrode of the obtained semiconductor light-emitting device, positive holes and electrons are injected into the MQW active layer from the p-side electrode and the n-side electrode, respectively, to be recombined with each other in the MQW active layer and thereby an optical gain is produced. Consequently, it is possible to generate laser oscillation with an emission wavelength of 404 nm.

In the semiconductor light-emitting device of the present example, a substrate with a low dislocation density, which can be obtained by liquid phase growth using an alkali metal based flux, is used as its substrate. Accordingly, the semiconductor light-emitting device has a lower threshold, improved luminous efficiency, and improved reliability as compared to conventional one produced on a GaN substrate with a high dislocation density.

Incidentally, GaN crystals may be obtained by the manufacturing method of the present invention, in which a substrate obtained by growing Group III nitride crystal thin film on a sapphire substrate by vapor phase growth is used as seed crystals. In such a case, the sapphire portion other the GaN crystals may be removed by grinding or the like, so as to produce a GaN substrate, on which a device can be manufactured.

As stated above, Group III nitride crystals obtained by the manufacturing method using the apparatus of the present invention is used as a substrate, and Group III nitride crystals further are epitaxial-grown on the substrate, whereby a semiconductor device provided with a semiconductor element such as a LD or LED can be obtained. The above description exemplifies GaN as one example of the Group III nitride crystals obtained by the manufacturing method of the present invention. However, the present invention is not limited to this, and even when other Group III nitride crystals obtained by the manufacturing method using the apparatus of the present invention are used, a semiconductor device provided with a semiconductor element such as a LD or LED can be obtained. Group III nitride crystals obtained by the manufacturing method of the present invention has a small defect density, thus realizing a light-emitting device having high reliability and free from device deterioration even when the optical output power is large.

The above description exemplifies the semiconductor element as a light-emitting device. However, the present invention is not limited to this, and an electronic device such as a field effect transistor (FET), for example, can be manufactured using Group III nitride crystals obtained by the manufacturing method of the present invention.

INDUSTRIAL APPLICABILITY

As described above, according to the present invention, a crystal manufacturing apparatus for growing high quality Group III nitride crystals, a manufacturing method of Group III nitride crystals using the same and a Group III nitride semiconductor element having excellent properties using the Group III nitride crystals obtained therethrough can be realized. Further, a GaN single crystal substrate obtained by the manufacturing method and the manufacturing apparatus of the present invention has a smaller dislocation density than a substrate manufactured by vapor phase growth (e.g., HVPE) or the like, which is significantly advantageous in increasing an output power of a semiconductor laser and increasing lifetime thereof.

The invention claimed is:

1. A crystal manufacturing method, comprising the steps of:
   preparing a crystal raw material solution containing Group III elements, nitrogen and at least one of an alkali metal and an alkaline-earth metal in a reactor vessel,
   applying heat and pressure thereto in an atmosphere of gas containing nitrogen so as to allow the nitrogen and the Group III elements in the crystal raw material solution to react with each other, whereby Group III nitride crystals are grown,
   wherein the reactor vessel has a gas inlet and a gas outlet, the reactor vessel and a gas supplying device are coupled,
   a flow velocity of the gas containing nitrogen at least one of the gas inlet and the gas outlet of the reactor vessel is in a range of 1 cm/sec to 500 cm/sec, and
   in the reactor vessel, the gas containing nitrogen introduced through the gas inlet that is not used for the reaction is exhausted through the gas outlet, and so that aggregation of the at least one of the alkali and the alkaline-earth metal at the gas inlet is suppressed, and
   at least one selected from the group consisting of (a) a baffle plate with at least one through hole formed therein and (b) a crucible, which contains the crystal raw material, having a lid with at least one pore through which the gas enters the crucible is placed in the reactor vessel, so that evaporation of the at least one of the alkali metal and the alkaline-earth metal from the crystal raw material solution is suppressed.

2. The manufacturing method according to claim 1,
   wherein the reactor vessel is stored in a pressure-resistant vessel,
   the reactor vessel and the gas supplying device are coupled via the gas inlet, and
   the gas containing nitrogen supplied from the gas supplying device firstly is introduced to the reactor vessel through the gas inlet, and then is exhausted through the gas outlet to at least one of an inside of the pressure-resistant vessel and an outside of the pressure-resistant vessel.

3. The manufacturing method according to claim 1, wherein, in the reactor vessel, a concentration gradient is formed for at least one of the alkali metal and the alkaline-earth metal evaporating from the crystal raw material solution.

4. The manufacturing method according to claim 2, wherein a junction is placed at the gas inlet or at both of the gas inlet and the gas outlet, and
   the reactor vessel is detachable from the inside of the pressure-resistant vessel.

5. The manufacturing method according to claim 4,
   wherein a gas open/close mechanism is placed at least one of the gas inlet and the gas outlet,
   prior to crystal manufacturing, outside of the pressure-resistant vessel, putting a crystal raw material containing Group III elements and at least one of an alkali metal and an alkaline-earth metal in the reactor vessel in an atmosphere of an inert gas,
   closing the gas open/close mechanism and hermetically sealing the reactor vessel,
   storing the reactor vessel in the pressure-resistant vessel,
   connecting with the gas supplying device via the junction,
   opening the gas open/close mechanisms, and
   in this state, allowing the gas to be introduced to the reactor vessel.

6. The manufacturing method according to claim 5, further comprising the step of, after putting the crystal raw material in the reactor vessel in an atmosphere of an inert gas outside of the pressure-resistant vessel, heating the reactor vessel to form the crystal raw material solution.

7. The manufacturing method according to claim 6, further comprising the step of, after forming the crystal raw material solution by heating the reactor vessel, performing agitation of the crystal raw material solution.

8. The manufacturing method according to claim 2,
   wherein gas containing nitrogen is introduced from the gas supplying device to the reactor vessel via a gas flow rate regulator,
   the pressure-resistant vessel has a gas outlet, to which a pressure regulator is connected,
   the gas flow rate regulator and the pressure regulator allow ambient pressures in the reactor vessel and in the pressure-resistant vessel to be controlled, and
   the gas containing nitrogen introduced to the reactor vessel is the same as gas introduced into the pressure-resistant vessel.

9. The manufacturing method according to claim 2,
   wherein the pressure-resistant vessel has a gas inlet,
   a first gas supplying device is connected to the gas inlet of the reactor vessel,
   the gas outlet of the reactor vessel directly communicates with an outside of the pressure-resistant vessel,
   a second gas supplying device is connected to the gas inlet of the pressure-resistant vessel,
   the first gas supplying device and the second gas supplying device allow ambient pressures in the reactor vessel and in the pressure-resistant vessel to be controlled independently, and
   the gas containing nitrogen introduced to the reactor vessel is different from gas introduced into the pressure-resistant vessel.

10. The manufacturing method according to claim 9, wherein the gas containing nitrogen introduced to the reactor vessel is nitrogen, and the gas introduced to the pressure-resistant vessel is a rare gas.

11. The manufacturing method according to claim 9, wherein the gas containing nitrogen introduced to the reactor vessel is nitrogen, and the gas introduced to the pressure-resistant vessel is air.

12. The manufacturing method according to claim 9, wherein the pressure-resistant vessel further has a gas outlet.

13. The manufacturing method according to claim 12,
   wherein gas containing nitrogen is introduced from the first gas supplying device to the reactor vessel via a first gas flow rate regulator,
   the gas outlet of the reactor vessel is connected to a first pressure regulator,
   gas is introduced from the second gas supplying device to the pressure-resistant vessel via a second gas flow rate regulator,
   the gas outlet of the pressure-resistant vessel is connected to a second pressure regulator,
   the first gas flow rate regulator and the first pressure regulator allow an ambient pressure in the reactor vessel to be controlled, and
   the second gas flow rate regulator and the second pressure regulator allow an ambient pressure in the pressure-resistant vessel to be controlled.

14. The manufacturing method according to claim 2, wherein the pressure-resistant vessel has a gas inlet,
a first gas supplying device is connected to the gas inlet of the reactor vessel,
the gas outlet of the reactor vessel directly communicates with an outside of the pressure-resistant vessel,
a second gas supplying device is connected to the gas inlet of the pressure-resistant vessel,
the first gas supplying device and the second gas supplying device allow ambient pressures in the reactor vessel and in the pressure-resistant vessel to be controlled independently, and
the gas containing nitrogen introduced to the reactor vessel and gas introduced into the pressure-resistant vessel have different purities.

15. The manufacturing method according to claim 14, wherein a purity of the gas containing nitrogen introduced to the reactor vessel is 99.9% or more and a purity of the gas introduced to the pressure-resistant vessel is 99% or less.

16. The manufacturing method according to claim 14, wherein the pressure-resistant vessel further has a gas outlet.

17. The manufacturing method according to claim 16,
wherein gas containing nitrogen is introduced from the first gas supplying device to the reactor vessel via a first gas flow rate regulator,
the gas outlet of the reactor vessel is connected to a first pressure regulator,
gas is introduced from the second gas supplying device to the pressure-resistant vessel via a second gas flow rate regulator,
the gas outlet of the pressure-resistant vessel is connected to a second pressure regulator,
the first gas flow rate regulator and the first pressure regulator allow an ambient pressure in the reactor vessel to be controlled, and
the second gas flow rate regulator and the second pressure regulator allow an ambient pressure in the pressure-resistant vessel to be controlled.

18. The manufacturing method according to claim 2, wherein prior to crystal manufacturing, an impurity gas removal treatment is performed for at least one of the reactor vessel and the pressure-resistant vessel.

19. The manufacturing method according to claim 18, wherein the impurity gas removal treatment is at least one of baking and evacuation.

20. The manufacturing method according to claim 1,
wherein the Group III elements are at least one selected from the group consisting of gallium, aluminum and indium, and
the crystals are $Al_xGa_yIn_{1-x-y}N$, wherein $0 \leqq x \leqq 1$, $0 \leqq x+y \leqq 1$.

21. The manufacturing method according to claim 1, wherein the gas containing nitrogen is a nitrogen gas, an ammonia gas or a mixed gas of the nitrogen gas and the ammonia gas.

22. The manufacturing method according to claim 21, wherein the gas containing nitrogen further comprises at least one of an inert gas and hydrogen gas.

23. The manufacturing method according to claim 1, wherein at least one of the gas inlet and the gas outlet has an inner diameter of 10 mm or less.

24. The manufacturing method according to claim 1, wherein the gas inlet is placed above the crystal raw material solution.

25. The manufacturing method according to claim 1, wherein the gas inlet and the gas outlet are placed above the crystal raw material solution.

26. The manufacturing method according to claim 1,
wherein the gas outlet and the gas inlet are placed an opposite side to the crystal raw material relative to the at least one selected from the group of the baffle plate and the lid of the crucible in the reactor vessel, and
the at least one of the baffle plate and the lid of the crucible is placed closer to a liquid surface of the crystal raw material solution than to the gas inlet and the gas outlet.

27. The manufacturing method according to claim 1, wherein a concentration of the at least one of the alkali metal and the alkaline-earth metal at a portion around the gas outlet is lower than at a portion close to a liquid surface of the crystal raw material.

* * * * *

UNITED STATES PATENT AND TRADEMARK OFFICE
CERTIFICATE OF CORRECTION

PATENT NO. : 7,754,012 B2  
APPLICATION NO. : 12/082745  
DATED : July 13, 2010  
INVENTOR(S) : Minemoto et al.

Page 1 of 1

It is certified that error appears in the above-identified patent and that said Letters Patent is hereby corrected as shown below:

Column 23, line 58 (claim 5): "at least" should read --at at least--.

Signed and Sealed this
Twenty-second Day of March, 2011

David J. Kappos
*Director of the United States Patent and Trademark Office*